(12) United States Patent
Kim et al.

(10) Patent No.: US 11,287,933 B2
(45) Date of Patent: Mar. 29, 2022

(54) PEN SENSING UNIT INCLUDING PEN SENSOR MEMBER CONNECTED TO PEN LINE AND PEN SCAN LINE AND DISPLAY DEVICE INCLUDING THE SAME

(71) Applicant: Samsung Display Co., Ltd., Yongin-Si (KR)

(72) Inventors: Chui Kim, Hwaseong-si (KR); Soo Jung Lee, Suwon-si (KR); Keum Dong Jung, Seoul (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/924,078

(22) Filed: Jul. 8, 2020

(65) Prior Publication Data

US 2021/0026493 A1 Jan. 28, 2021

(30) Foreign Application Priority Data

Jul. 22, 2019 (KR) .......................... 10-2019-0088595

(51) Int. Cl.
*G06F 3/044* (2006.01)
*H01L 27/32* (2006.01)
*G06F 3/0354* (2013.01)
*G06K 9/00* (2006.01)

(52) U.S. Cl.
CPC ........ *G06F 3/0443* (2019.05); *G06F 3/03545* (2013.01); *G06K 9/00013* (2013.01); *H01L 27/323* (2013.01); *H01L 27/3234* (2013.01); *H01L 27/3244* (2013.01); *G06F 2203/04106* (2013.01)

(58) Field of Classification Search
CPC ............... G06F 3/0443; G06F 3/03545; G06F 2203/04106; G06F 3/046; G06F 3/04166; G06F 3/04164; G06F 2203/04112; G06F 3/0446; G06F 3/04162; H01L 27/3244; H01L 27/323; H01L 27/3234; G06K 9/00013; G06K 9/0002; G06K 9/209
See application file for complete search history.

(56) References Cited

U.S. PATENT DOCUMENTS

| | | | |
|---|---|---|---|
| 5,792,997 A | 8/1998 | Fukuzaki | |
| 9,448,673 B2* | 9/2016 | Hirotsune | ............ G06F 3/0416 |
| 9,946,375 B2 | 4/2018 | Akhavan Fomani et al. | |
| 2008/0238885 A1* | 10/2008 | Zachut | ................... G06F 3/046 |
| | | | 345/174 |
| 2011/0155479 A1* | 6/2011 | Oda | ........................ G06F 3/044 |
| | | | 178/18.06 |

(Continued)

FOREIGN PATENT DOCUMENTS

KR 10-1131373 B1 4/2012

*Primary Examiner* — David D Davis
(74) *Attorney, Agent, or Firm* — Innovation Counsel LLP

(57) ABSTRACT

A pen sensing unit and a display device are disclosed. The pen sensing unit comprises a first pen line, a pen scan line, and a pen sensor member. The first pen line extends in a first direction. The pen scan line extends in a second direction that intersects the first direction. The pen sensor member is connected to the first pen line and the pen scan line. The pen sensor member is configured to sense input from a pen. The pen sensor member comprises a pen sensor and a pen sensor circuit. The pen sensor circuit is connected to a first end of the pen sensor. The pen sensor circuit comprises a first thin film transistor.

19 Claims, 38 Drawing Sheets

(56) References Cited

U.S. PATENT DOCUMENTS

| | | | |
|---|---|---|---|
| 2014/0267191 A1* | 9/2014 | Takahara | G06F 3/03545 |
| | | | 345/179 |
| 2015/0339563 A1* | 11/2015 | Park | G02F 1/133512 |
| | | | 349/43 |
| 2016/0188007 A1* | 6/2016 | Jung | G06F 3/04162 |
| | | | 345/173 |
| 2016/0291785 A1* | 10/2016 | Mizuhashi | G06F 3/0412 |
| 2017/0006245 A1 | 1/2017 | Akhavan Fomani et al. | |
| 2018/0018053 A1* | 1/2018 | No | G06F 3/03545 |
| 2018/0151144 A1* | 5/2018 | Kawashima | G06F 3/0443 |
| 2018/0364845 A1* | 12/2018 | Lee | G06F 3/0443 |
| 2019/0138128 A1* | 5/2019 | Hwang | G06F 3/0448 |
| 2019/0138131 A1* | 5/2019 | Kim | G06F 3/0443 |
| 2021/0064841 A1* | 3/2021 | Kim | G06F 3/03545 |

* cited by examiner

PSC   PS
   PSP

PEN SENSING UNIT INCLUDING PEN SENSOR MEMBER CONNECTED TO PEN LINE AND PEN SCAN LINE AND DISPLAY DEVICE INCLUDING THE SAME

This application claims priority to and benefit of from Korean Patent Application No. 10-2019-0088595 filed on Jul. 22, 2019 in the Korean Intellectual Property Office, the disclosure of the Korean Patent Application is incorporated herein by reference in its entirety.

BACKGROUND

1. Field of the Disclosure

The technical field relates to a pen sensing unit and a display device including the same.

2. Description of the Related Art

The importance of display devices has increased with the prevalence of multimedia. In the space of display devices, various kinds of display devices such as a liquid crystal display (LCD) device and an organic light emitting diode (OLED) display device have been used.

Particularly, the OLED display device displays images using an OLED that generates light by recombination of electrons and holes. Such an OLED display device has advantages of having high luminance and large viewing angle and being driven with low power consumption while having a fast response speed.

In recent years, research and development have also been carried out regarding the technology of sensing input by pen as well as input by the fingers of a user.

SUMMARY

Aspects of the present disclosure provide a pen sensing unit with improved ability to sense input by pen and a display device including the same.

It should be noted that objects of the present disclosure are not limited to the above-mentioned objects, and other unmentioned objects will be clearly understood by those skilled in the art from the following descriptions.

An embodiment of a pen sensing unit includes a first pen line, a pen scan line, and a pen sensor member. The first pen line extends in a first direction. The pen scan line extends in a second direction that intersects the first direction. The pen sensor member connects to the first pen line and the pen scan line. The pen sensor member is configured sense input from a pen. The pen sensor member includes a pen sensor and a pen sensor circuit connected to a first end of the pen sensor. The pen sensor circuit includes a first thin film transistor.

The pen sensing unit may have wherein a gate electrode of the first thin film transistor is connected to the pen scan line, a first electrode of the first thin film transistor is connected to the first end of the pen sensor, and a second electrode of the first thin film transistor is connected to the first pen line.

The pen sensing unit may have wherein the first thin film transistor is configured to connect the first pen line with the first end of the pen sensor when a scan signal applied to the pen scan line turns on the first thin film transistor.

The pen sensing unit may have wherein a second end of the pen sensor is connected to a ground power source.

The pen sensing unit may have wherein the pen sensor has a spirally wound shape.

The pen sensing unit may have wherein a length of the pen sensor member in the first direction and a length of the pen sensor member in the second direction are each from 1 mm to 10 mm.

The pen sensing unit may have wherein the pen sensor member is a plurality of pen sensor members arranged together in a matrix.

The pen sensing unit may have wherein the pen sensor circuit further includes a second thin film transistor, a gate electrode of the first thin film transistor is connected to the pen scan line, a first electrode of the first thin film transistor is connected to a gate electrode of the second thin film transistor, and a second electrode of the first thin film transistor is connected to the first pen line.

The pen sensing unit may further comprise a second pen line spaced apart from the first pen line. The pen sensor member is disposed between the first pen line and the second pen line. The pen sensor circuit further includes a first driving voltage line. The gate electrode of the second thin film transistor is connected to the first electrode of the first thin film transistor. A first electrode of the second thin film transistor is connected to the first end of the pen sensor. A second electrode of the second thin film transistor is connected to the first driving voltage line.

The pen sensing unit of may have wherein the first electrode of the second thin film transistor is further connected to the second pen line.

The pen sensing unit of may further comprise a capacitor disposed between the driving voltage line and a gate electrode of the second thin film transistor.

The pen sensing unit may have wherein a second end of the pen sensor is connected to a ground power source.

The pen sensor circuit may include a third thin film transistor and a second driving voltage line spaced apart from the first driving voltage line. A gate electrode of the third thin film transistor is connected to the first electrode of the second thin film transistor. A first electrode of the third thin film transistor is connected to the second pen line and a ground power source. A second electrode of the third thin film transistor is connected to the second driving voltage line.

The pen sensing unit may further comprise a capacitor disposed between the driving voltage line and the gate electrode of the second thin film transistor.

The pen sensing unit may have wherein a second end of the pen sensor is connected to a ground power source.

The pen sensing unit may have wherein the pen sensor has a spirally wound shape in a plan view.

An embodiment of a display device includes a display unit and a pen sensing unit. The display unit includes a plurality of pixels. The pen sensing unit is disposed below the display unit and comprises a plurality of pen lines, a pen scan line, and a plurality of pen sensor members. The plurality of pen lines extends in a first direction. The pen scan line extends in a second direction that intersects the first direction. Each of the sensor members connects to the pen scan line and a pen line among the plurality of pen lines. Each of the sensor members are configured to sense input from a pen. Each of the pen sensor members is configured to sense input from a pen. Each of the pen sensor members includes a pen sensor and a pen sensor circuit. The pen sensor circuit is connected is connected to a first end of the pen sensor. The pen sensor circuit includes a first thin film transistor.

The display device may have wherein a gate electrode of the first thin film transistor is connected to the pen scan line, a first electrode of the first thin film transistor is connected to the first end of the pen sensor, and a second electrode of the first thin film transistor is connected to the pen line.

The display device may have wherein the first thin film transistor is configured connect the pen line and the first end of the pen sensor when a scan signal applied to the pen scan line turns on the first thin film transistor, a second end of the pen sensor is connected to a ground power source, and the pen sensor has a spirally wound shape.

The display device may further comprise a touch sensing unit disposed over the display unit and configured to sense a user's touch; and a fingerprint sensing unit disposed between the display unit and the pen sensing unit and configured to recognize a user's fingerprint pattern.

The details of other embodiments are incorporated in the detailed description and the accompanying drawings.

BRIEF DESCRIPTION OF THE DRAWINGS

The above and other aspects and features of the present disclosure will become more apparent by describing in detail illustrative embodiments with reference to the attached drawings, in which.

DETAILED DESCRIPTION OF THE EMBODIMENTS

Figure 1:
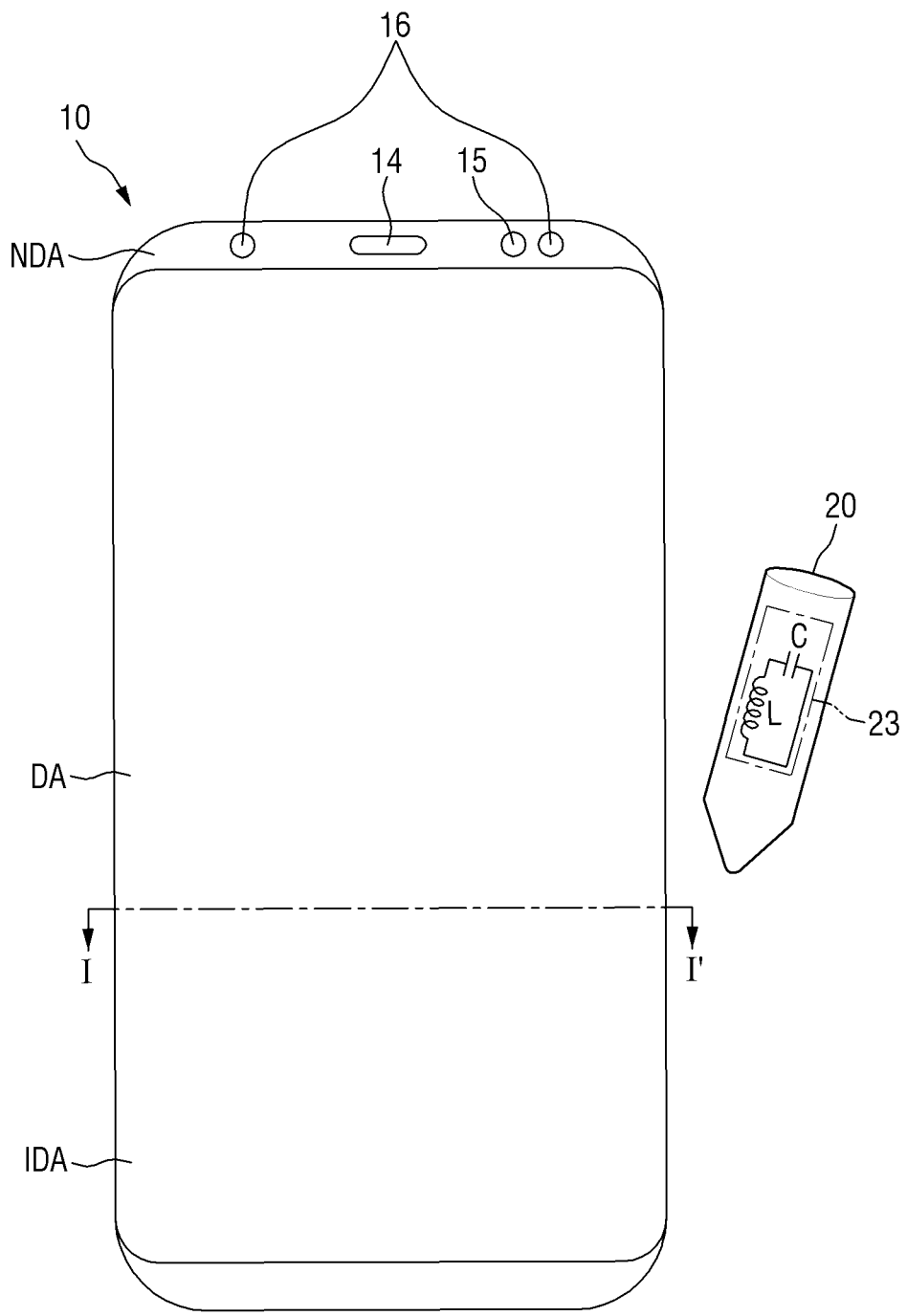
FIG. 1 is a plan view schematically illustrating a display device according to an embodiment.

The present inventive concept will now be described more fully hereinafter with reference to the accompanying drawings, in which embodiments of the inventive concept are shown. This inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. The same reference numbers indicate the same components throughout the specification. In the attached figures, the thickness of layers and regions is exaggerated for clarity.

When a layer is referred to as being "on" another layer or substrate, it can be directly on the other layer or substrate, or intervening layers may also be present. In contrast, when an element is referred to as being "directly on" another element, there are no intervening elements present. In the drawings, dimensions of elements may be exaggerated for clarity. When an element extends in an indicated direction, the lengthwise direction of the element is equivalent to or parallel to the indicated direction. The term "connect" may mean "electrically connect." The term "insulate" may mean "electrically insulate."

Although the terms "first," "second," etc. may be used to describe various elements, these elements should not be limited by these terms. These terms may be used to distinguish one element from another element. A first element may be termed a second element without departing from teachings of one or more embodiments. The description of an element as a "first" element may not require or imply the presence of a second element or other elements. The terms "first," "second," etc. may be used to differentiate different categories or sets of elements. For conciseness, the terms "first," "second," etc. may represent "first-type (or first-set)," "second-type (or second-set)," etc., respectively. Embodiments are described herein with reference to plan and cross-section illustrations that are schematic illustrations of idealized embodiments of the present disclosure. As such, variations from the shapes of the illustrations as a result, for example, of manufacturing techniques and/or tolerances, are to be expected. Thus, embodiments of the present disclosure should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the present disclosure.

Hereinafter, specific embodiments will be described with reference to the accompanying drawings.

FIG. 1 is a plan view schematically illustrating a display device according to an embodiment.

Referring to FIG. 1, a display device 10 according to an embodiment of the present inventive concept may be divided into a display area DA and a non-display area NDA.

The display area DA is an area in which an image is displayed, and a plurality of pixels may be disposed therein. Also, the display area DA may be used as a sensing member for sensing an external environment. In an embodiment, the display area DA may be an input sensing area IDA for recognizing a user's touch input, fingerprint pattern, pen input, and the like. That is, the input sensing area IDA may include a plurality of pixels and a plurality of sensors. That is, the input sensing area IDA may both display an image and be used as an area for recognizing a user's touch input, fingerprint pattern, and pen input.

The input sensing area IDA is illustrated in FIG. 1 as having the same area as the display area DA. The input sensing area IDA may also be disposed in a partial area of the display area DA. Also, in embodiments, areas for recognizing a user's touch input, fingerprint pattern, pen input, and the like may be set to be different from each other.

The non-display area NDA is defined as an area disposed at an outer side of the display area DA and in which an image is not displayed. A speaker module 14, a camera module 15, and a sensor module 16 may be disposed in the non-display area NDA. In an embodiment, the sensor module 16 may include at least one of an illuminance sensor, a proximity sensor, an infrared sensor, and an ultrasonic sensor. In an embodiment, the sensor module 16 may also perform a function of recognizing a user's iris.

In an embodiment, the display area DA may have a flat shape. In an embodiment, at least a partial area of the display area DA may be bent. Also, the display area DA may be disposed in an edge area of the display device 10.

The display device 10 may include an accommodating groove capable of accommodating a pen 20. The pen 20 is in a configuration required for delivering input by pen and may be a configuration separate from the display device. In an embodiment, the pen 20 may also be a configuration included in the display device. Also, in some embodiments, the pen 20 may be provided as a plurality of pens.

In some embodiments, the pen 20 may include a resonance circuit 23. For convenience of description, the resonance circuit 23 is illustrated in FIG. 1 as including a single capacitor C and a single inductor L. Embodiments include more than one capacitor C and/or more than one inductor L. Also, according to varying circumstances, the pen 20 may include a plurality of resonance circuits 23.

Figure 2:
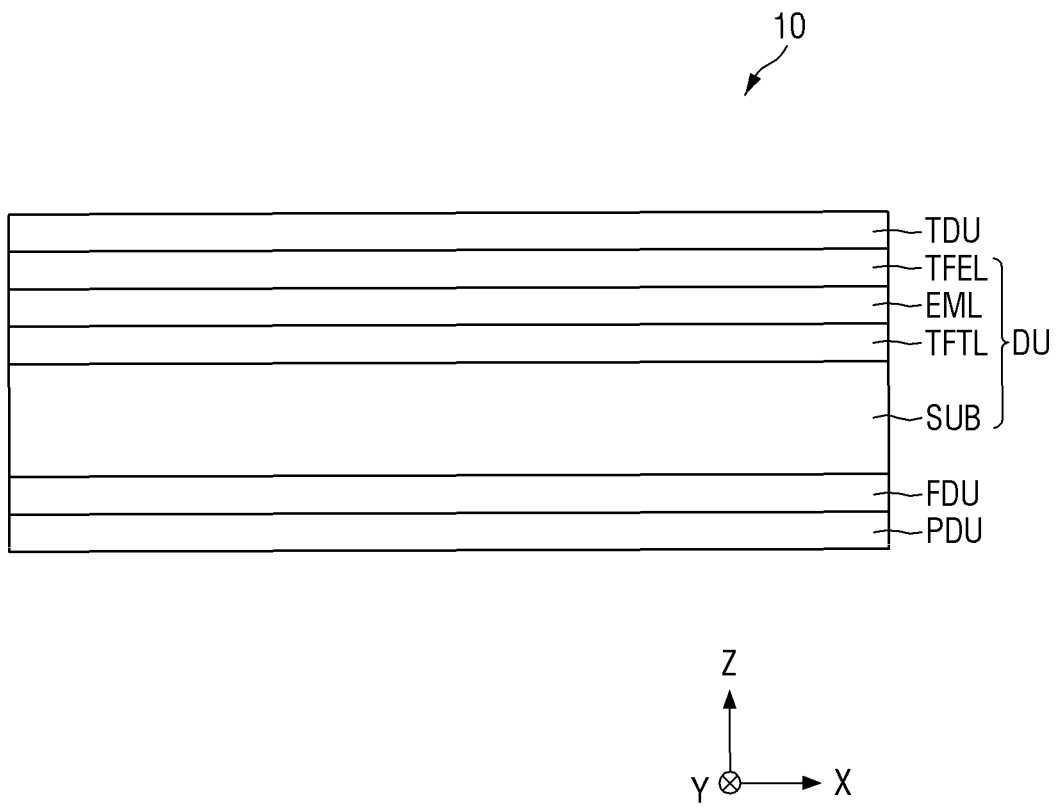
FIG. 2 is a cross-sectional view taken along line I-I' of FIG. 1.

FIG. 2 is a cross-sectional view taken along line I-I' of FIG. 1.

Referring to FIG. 2, the display device 10 may include a display unit DU, a touch sensing unit TDU disposed on the display unit DU, a fingerprint sensing unit FDU disposed below the display unit DU, and a pen sensing unit PDU disposed below the fingerprint sensing unit FDU.

The display unit DU may include a substrate SUB and a thin film transistor layer TFTL, a light emitting element layer EML, and a thin film encapsulation layer TFEL which are disposed on the substrate SUB.

The substrate SUB may be formed of an insulating material such as glass, quartz, and/or polymer resin. Examples of the polymer resin include polyether sulfone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CTA), cellulose acetate propionate (CAP), or combinations of any of the listed polymer resins. The substrate SUB may also include a metallic material.

The substrate SUB may be a rigid substrate or a flexible substrate which is bendable, foldable, rollable, or the like. When the substrate SUB is a flexible substrate, the substrate SUB may be formed of PI.

Figure 3:
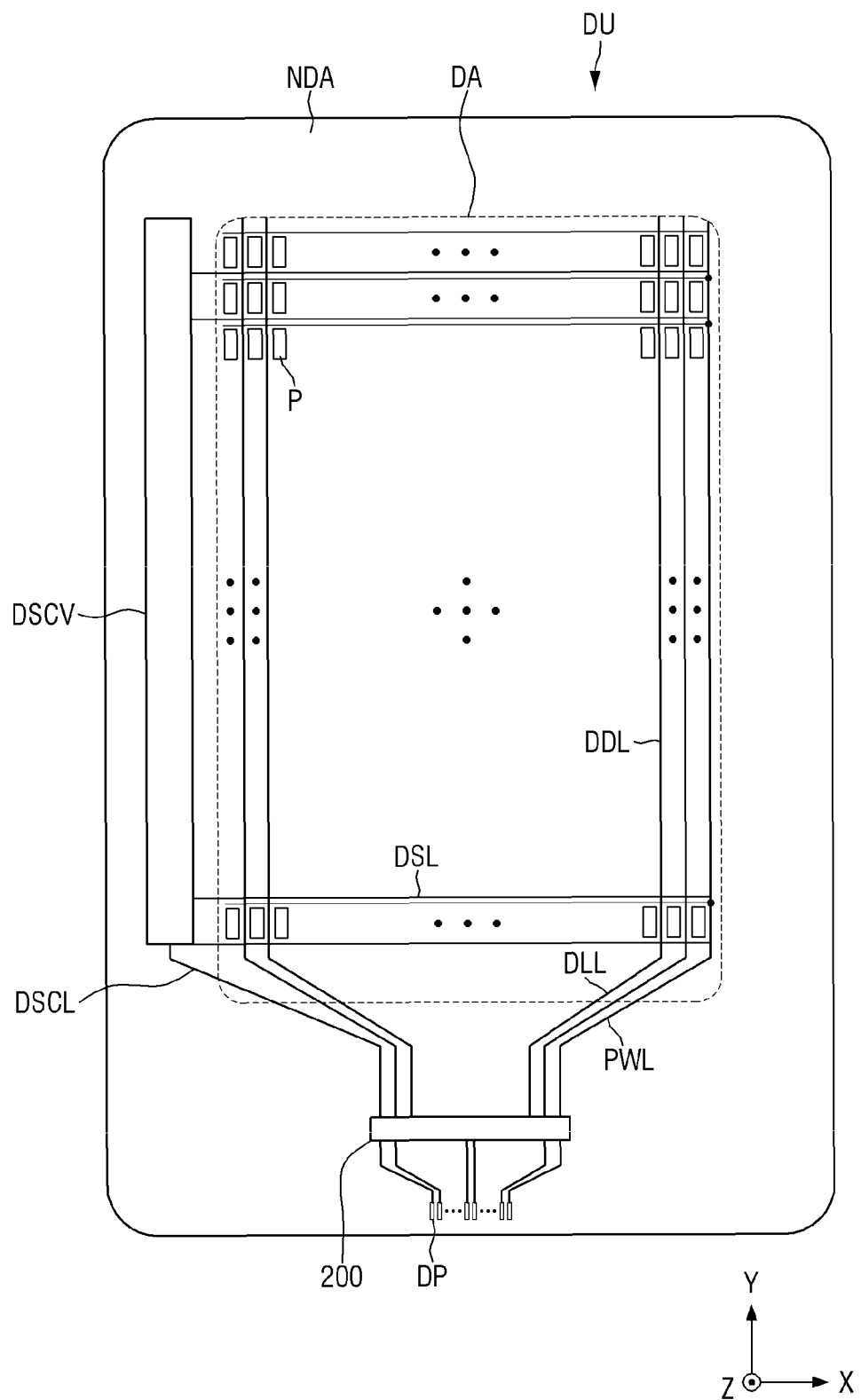
FIG. 3 is an illustrative view showing in detail an example of a display unit of FIG. 2.

The thin film transistor layer TFTL may be disposed on the substrate SUB. In addition to thin film transistors for each pixel, display scan lines, display data lines, power lines, display scan control lines, and routing lines that connect display pads and the display data lines may be formed on the thin film transistor layer TFTL. Each thin film transistor may include a gate electrode, a semiconductor layer, a source electrode, and a drain electrode. When a display scan driver DSCV is formed in the non-display area NDA of the display unit DU as illustrated in FIG. 3, the display scan driver DSCV may include the thin film transistors.

The thin film transistor layer TFTL may be disposed in the display area DA and the non-display area NDA. Specifically, the thin film transistors for each pixel, the scan lines, the data lines, and the power lines of the thin film transistor layer TFTL may be disposed in the display area DA. The scan control lines and link lines of the thin film transistor layer TFTL may be disposed in the non-display area NDA.

The light emitting element layer EML may be disposed on the thin film transistor layer TFTL. The light emitting element layer EML may include pixels each including a first electrode, a light emitting layer, and a second electrode, and a pixel defining film defining the pixels. The light emitting layer may be an organic light emitting layer including an organic material. The light emitting layer may include a hole transporting layer, an organic light emitting layer, and an electron transporting layer. When a predetermined voltage is applied to the first electrode and a cathode voltage is applied to the second electrode through the thin film transistors of the thin film transistor layer TFTL, holes and electrons are moved to the organic light emitting layer through the hole transporting layer and the electron transporting layer. The holes and electrons combine with each other at the organic light emitting layer, thereby emitting light. The pixels of the light emitting element layer EML may be disposed in the display area DA.

The thin film encapsulation layer TFEL may be disposed on the light emitting element layer EML. The thin film encapsulation layer TFEL prevents permeation of oxygen or moisture into the light emitting element layer EML. To this end, the thin film encapsulation layer TFEL may include at least one inorganic film. The inorganic film may be a silicon nitride layer, a silicon oxynitride layer, a silicon oxide layer, a titanium oxide layer, and/or an aluminum oxide layer. Also, the thin film encapsulation layer TFEL protects the light emitting element layer EML from foreign substances such as dust. To this end, the thin film encapsulation layer TFEL may include at least one organic film. The organic film may be acrylic resin, epoxy resin, phenolic resin, polyamide resin, and/or polyimide resin.

The thin film encapsulation layer TFEL may be disposed in both the display area DA and the non-display area NDA. Specifically, the thin film encapsulation layer TFEL may be disposed to cover the light emitting element layer EML in the display area DA and the non-display area NDA, as well as cover the thin film transistor layer TFTL in the non-display area NDA.

The touch sensing unit TDU may be disposed on the thin film encapsulation layer TFEL of the display unit DU. The placement of the touch sensing unit TDU directly on the thin film encapsulation layer TFEL is advantageous. Such placement reduces the thickness of the display device 10 as compared to when a separate touch panel including the touch sensing unit TDU is attached onto the thin film encapsulation layer TFEL.

The touch sensing unit TDU may include touch electrodes for sensing a user's touch by means of capacitance and touch lines connecting pads and the touch electrodes. For example, the touch sensing unit TDU may sense a user's touch by means of self-capacitance or mutual capacitance.

Figure 4:
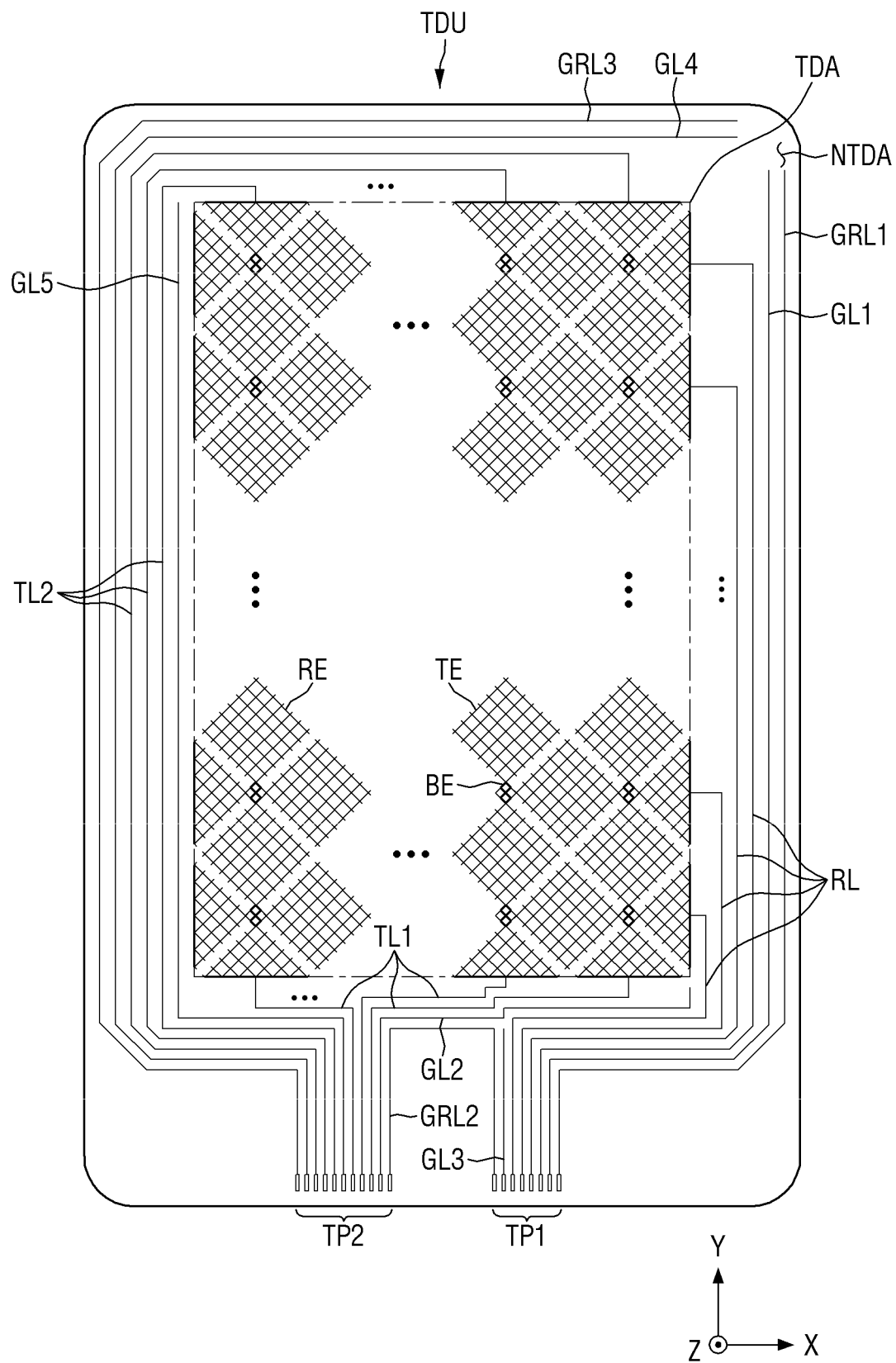
FIG. 4 is an illustrative view showing in detail an example of a touch sensing unit of FIG. 2.

As illustrated in FIG. 4, the touch electrodes of the touch sensing unit TDU may be disposed in a touch sensing area TDA which overlaps with the display area DA. As illustrated in FIG. 4, the touch lines of the touch sensing unit TDU may be disposed in a non-touch sensing area NTDA which overlaps with the non-display area NDA.

Although not illustrated, a cover window may be additionally disposed on the touch sensing unit TDU. In this case, the touch sensing unit TDU and the cover window may be attached by a transparent adhesive member such as an optically clear adhesive (OCA) film.

The fingerprint sensing unit FDU may be disposed below the substrate SUB of the display unit DU. The fingerprint sensing unit FDU may use an organic light emitting element, which is provided in each pixel of the display unit DU, as a light source for fingerprint recognition. The fingerprint sensing unit FDU may include fingerprint recognition sensors FPS illustrated in FIG. 5. Also, the fingerprint sensing unit FDU may be in the form of an array including the fingerprint recognition sensors FPS.

In some embodiments, the fingerprint recognition sensors FPS included in the fingerprint sensing unit FDU may be light sensors. For example, the fingerprint recognition sensors FPS may be formed of photodiodes, complementary metal oxide semiconductor (CMOS) image sensors, charge-coupled device (CCD) cameras, or the like.

When a user's finger comes into contact with the cover window, light output from the light emitting element layer EML is reflected by ridges or valleys of a user's fingerprint, and the reflected light is received by the fingerprint sensing unit FDU. In this way, the fingerprint sensing unit FDU may recognize a user's fingerprint pattern.

The pen sensing unit PDU may be disposed below the fingerprint sensing unit FDU. The fingerprint sensing unit FDU may include pen sensor members PSP illustrated in FIG. 6. The pen sensor member PSP may be formed of an electromagnetic resonance (EMR) sensor. When a driving signal is applied to the pen sensor member PSP, an electromagnetic field is generated in a pen sensor of the pen sensor member PSP, and the pen 20 having a resonance circuit 23 provided therein resonates due to the electromagnetic field, holds a resonant frequency for a predetermined amount of time, and outputs the electromagnetic field back to the pen sensor member PSP. In this way, the pen sensor member may sense the electromagnetic field output from the pen and sense a contact position of the pen 20. The resonance circuit 23 is an LC composite circuit and is a circuit in which the maximum current flows at a specific frequency of applied power. The resonant frequency may extract output characteristics of only a specific frequency band.

The arrangement order of the display unit DU, the touch sensing unit TDU, the fingerprint sensing unit FDU, and the pen sensing unit PDU that is illustrated in FIG. 2 is merely an example, and the arrangement order may be rearranged. Also, some of the display unit DU, the touch sensing unit TDU, the fingerprint sensing unit FDU, and the pen sensing unit PDU may be omitted. Also, although the display unit DU, the touch sensing unit TDU, the fingerprint sensing unit FDU, and the pen sensing unit PDU are illustrated as separate configurations, this is merely an example, and some of the display unit DU, the touch sensing unit TDU, the fingerprint sensing unit FDU, and the pen sensing unit PDU may be integrated.

FIG. 3 is an illustrative view showing in detail an example of a display unit of FIG. 2.

In FIG. 3, for convenience of description, only pixels P, display scan lines DSL, display data lines DDL, a power line PWL, display scan control lines DSCL, a display scan driver DSCV, a display driving circuit 200, and display pads DP of the display unit DU are illustrated.

The display scan lines DSL, the display data lines DDL, the power line PWL, and the pixels P are disposed in the display area DA. The display scan lines DSL may be parallel to each other in a first direction (X-axis direction), and the display data lines DDL may be parallel to each other in a second direction (Y-axis direction) intersecting the first direction (X-axis direction). The power line PWL may include at least one line parallel with the display data lines DDL in the second direction (Y-axis direction) and a plurality of lines branched from the at least one line in the first direction (X-axis direction).

Each pixel P may be connected to at least one of the display scan lines DSL, any one of the display data lines DDL, and the power line PWL. Each pixel P may include thin film transistors, which include a driving transistor and at least one switching transistor, an organic light emitting diode (OLED), and a capacitor. Each pixel P may receive a data voltage of the display data line DDL when a scan signal is applied from the display scan line DSL and may supply a driving current to the OLED according to a data voltage applied to a gate electrode, thereby emitting light.

The display scan driver DSCV is connected to the display driving circuit 200 through at least one display scan control line DSCL. Therefore, the display scan driver DSCV may receive a display scan control signal of the display driving circuit 200. The display scan driver DSCV generates scan signals according to the display scan control signal and supplies the generated scan signals to the display scan lines DSL.

The display scan driver DSCV is illustrated in FIG. 3 as being formed in the non-display area NDA at the left outer side of the display area DA. In an embodiment, the display scan driver DSCV may be formed in the non-display area NDA at the left outer side and the right outer side of display area DA.

The display driving circuit 200 is connected to the display pads DP and receives digital video data and timing signals. The display driving circuit 200 converts the digital video data to analog positive/negative data voltages and supplies the analog positive/negative data voltages to the display data lines DDL through link lines DLL. Also, the display driving circuit 200 generates and supplies a scan control signal for controlling the display scan driver DSCV through the display scan control line DSCL. Pixels P to which the data voltages will be supplied are selected by the scan signals of the display scan driver DSCV, and the data voltages are supplied to the selected pixels P. The display driving circuit 200 may be formed as an integrated circuit (IC) and attached onto the substrate SUB using a chip-on-glass (COG) method, a chip-on-plastic (COP) method, or an ultrasonic bonding method.

FIG. 4 is an illustrative view showing in detail an example of a touch sensing unit of FIG. 2.

In FIG. 4, for convenience of description, only the touch electrodes TE and RE, touch lines TL and RL, and touch pads TP are illustrated.

Referring to FIG. 4, the touch sensing unit TDU includes the touch sensing area TDA for sensing a user's touch and the non-touch sensing area NTDA disposed around the touch sensing area TDA. The touch sensing area TDA may overlap with the display area DA of a display panel 100, and the non-touch sensing area NTDA may overlap with the non-display area NDA of the display panel 100.

The touch electrodes TE and RE may be disposed in the touch sensing area TDA. The touch electrodes TE and RE may include sensing electrodes RE which are electrically connected in the first direction (X-axis direction) and driving electrodes TE which are electrically connected in the second direction (Y-axis direction) intersecting the first direction (X-axis direction). The sensing electrodes RE and the driving electrodes TE are illustrated in FIG. 4 as being formed in a diamond shape in a plan view.

In order to the prevent the sensing electrodes RE and the driving electrodes TE from being short-circuited from each other in areas where they cross, the driving electrodes TE adjacent to each other in the second direction (Y-axis direction) may be electrically connected through connecting electrodes BE. The driving electrodes TE and the sensing electrodes RE may be disposed on a single layer, and the connecting electrodes BE may be disposed on a different layer from the driving electrodes TE and the sensing electrodes RE. Also, the sensing electrodes RE electrically connected in the first direction (X-axis direction) and the driving electrodes TE electrically connected in the second direction (Y-axis direction) are electrically insulated from each other.

The touch lines TL and RL may be disposed in the non-touch sensing area NTDA. The touch lines TL and RL may include sensing lines RL connected to the sensing electrodes RE and first driving lines TL1 and second driving lines TL2 connected to the driving electrodes TE.

The sensing electrodes RE disposed at the right side of the touch sensing area TDA may be connected to the sensing lines RL. For example, among the sensing electrodes RE electrically connected in the first direction (X-axis direction), the sensing electrode RE disposed at a right side end may be connected to the sensing line RL. The sensing lines RL may be connected to first touch pads TP1. Thus, a touch driving circuit 400 may be electrically connected to the sensing electrodes RE.

In some embodiments, the driving electrodes TE disposed at a lower side of the touch sensing area TDA may be connected to the first driving lines TL1, and the driving electrodes TE disposed at an upper side of the touch sensing area TDA may be connected to the second driving lines TL2. For example, among the driving electrodes TE electrically connected in the second direction (Y-axis direction), the driving electrode TE disposed at a lower side end may be connected to the first driving line TL1, and the driving electrode TE disposed at an upper side end may be connected to the second driving line TL2. The second driving lines TL2 may be connected from an upper side of the touch sensing area TDA to the driving electrodes TE via the left outer side of the touch sensing area TDA. The first driving lines TL1 and the second driving lines TL2 may be connected to second touch pads TP2. Thus, the touch driving circuit 400 may be electrically connected to the driving electrodes TE.

The touch electrodes TE and RE may be driven by means of mutual capacitance or self-capacitance. When the touch electrodes TE and RE are driven by means of mutual capacitance, mutual capacitances are formed in the crossing areas of the sensing electrodes RE and the driving electrodes TE. These mutual capacitances are charged by supplying driving signals to the driving electrodes TE through the first driving lines TL1 and the second driving lines TL2. Then, changes in charges of the sensing electrodes RE are measured through the sensing lines RL, which determine whether a touch has been input. The driving signal may be a signal having a plurality of driving pulses.

When the touch electrodes TE and RE are driven by means of self-capacitance, self-capacitances of the driving electrodes TE and the sensing electrodes RE are charged by supplying driving signals to all of the driving electrodes TE and the sensing electrodes RE through the first driving lines TL1, the second driving lines TL2, and the sensing lines RL. Then, changes in charges of the self-capacitances of the driving electrodes TE and the sensing electrodes RE are measured through the first driving lines TL1, the second driving lines TL2, and the sensing lines RL. The changes in charges of the self-capacitances determine whether a touch has been inputto.

The driving electrodes TE, the sensing electrodes RE, and the connecting electrodes BE may be formed as mesh-like electrodes as illustrated in FIG. 4. When the touch sensing unit TDU including the driving electrodes TE and the sensing electrodes RE is formed directly on the thin film encapsulation layer TFEL as illustrated in FIG. 2, since a distance between the second electrode of the light emitting element layer EML and the driving electrodes TE or sensing electrodes RE of a touch sensor layer TSL is small, very high parasitic capacitance may be formed between the second electrode of the light emitting element layer EML and the driving electrode TE or sensing electrode RE of the touch sensor layer TSL. Therefore, for reducing the parasitic capacitance, it is more preferable to form the driving electrodes TE and the sensing electrodes RE with mesh-like electrodes as illustrated in FIG. 4 than to form the driving electrodes TE and the sensing electrodes RE with non-patterned electrodes of a transparent oxide conductive layer such as indium tin oxide (ITO) or indium zinc oxide (IZO).

In some embodiments, a first guard line GL1 may be disposed at an outer side of the sensing line RL disposed at the outermost side among the sensing lines RL. Also, a first ground line GRL1 may be disposed at an outer side of the first guard line GL1. That is, the first guard line GL1 may be disposed at a right side of the sensing line RL disposed at a right side end among the sensing lines RL, and the first ground line GRL1 may be disposed at a right side of the first guard line GL1.

In some embodiments, a second guard line GL2 may be disposed between the sensing line RL disposed at the innermost side among the sensing lines RL and the first driving line TL1 disposed at a right side end among the first driving lines TL1. Also, the second guard line GL2 may be disposed between the first driving line TL2 disposed at the right side end among the first driving lines TL1 and a second ground line GRL2. Further, a third guard line GL3 may be disposed between the sensing line RL disposed at the innermost side among the sensing lines RL and the second ground line GRL2. The second ground line GRL2 may be connected to a first touch pad disposed at the leftmost side among the first touch pads TP1 and a second touch pad disposed at the rightmost side among the second touch pads TP2.

In some embodiments, a fourth guard line GL4 may be disposed at an outer side of the second driving line TL2 disposed at the outermost side among the second driving lines TL2. Also, a third ground line GRL3 may be disposed at an outer side of the fourth guard line GL4. That is, the fourth guard line GL4 may be disposed at left sides and upper sides of the second driving lines TL2 disposed at a left side end and an upper side end among the second driving lines TL2, and the third ground line GRL3 may be disposed at a left side and an upper side of the fourth guard line GL4.

In some embodiments, a fifth guard line GL5 may be disposed at an inner side of the second driving line TL2 disposed at the innermost side among the second driving lines TL2. That is, the fifth guard line GL5 may be disposed between the touch electrodes TE and RE and the second driving line TL2 disposed at the right side end among the second driving lines TL2.

According to an embodiment illustrated in FIG. 4, the first ground line GRL1, the second ground line GRL2, and the third ground line GRL3 are disposed at the outermost side at an upper side, a left side, and a right side of the display panel 100. Also, a ground voltage is applied to the first ground line GRL1, the second ground line GRL2, and the third ground line GRL3. Thus, when static electricity is applied from the outside, the static electricity may be discharged to the first ground line GRL1, the second ground line GRL2, and the third ground line GRL3.

Also, according to the embodiment illustrated in FIG. 4, since the first guard line GL1 is disposed between the first ground line GRL1 and the sensing line RL disposed at the outermost side, the first guard line GL1 may serve to minimize influence of a change in a voltage of the first ground line GRL1 on the sensing line RL disposed at the outermost side. The second guard line GL2 is disposed between the sensing line RL disposed at the innermost side and the first driving line TL1 disposed at the outermost side. Thus, the second guard line GL2 may serve to minimize influence of a voltage change on the sensing line RL disposed at the innermost side and the first driving line TL1 disposed at the outermost side. Since the third guard line GL3 is disposed between the second ground line GRL2 and the sensing line RL disposed at the innermost side, the third guard line GL3 may serve to minimize an influence of a change in a voltage of the second ground line GRL2 on the sensing line RL disposed at the innermost side. Since the fourth guard line GL4 is disposed between the third ground line GRL3 and the second driving line TL2 disposed at the outermost side, the fourth guard line GL4 may serve to minimize an influence of a change in a voltage of the third ground line GRL3 on the second driving line TL2 disposed at the outermost side. Since the fifth guard line GL5 is disposed between the touch electrodes TE and RE and the second driving line TL2 disposed at the innermost side, the fifth guard line GL5 may serve to minimize mutual influence between the touch electrodes TE and RE and the second driving line TL2 disposed at the innermost side on each other.

When the touch electrodes TE and RE are driven by means of mutual capacitance, a ground voltage may be applied to the first guard line GL1, the second guard line GL2, the third guard line GL3, the fourth guard line GL4, and the fifth guard line GL5. When the touch electrodes TE and RE are driven by means of self-capacitance, driving signals which are the same as the driving signals applied to the first driving lines TL1, the second driving lines TL2, and the sensing lines RL may be applied to the first guard line GL1, the second guard line GL2, the third guard line GL3, the fourth guard line GL4, and the fifth guard line GL5.

Figure 5:
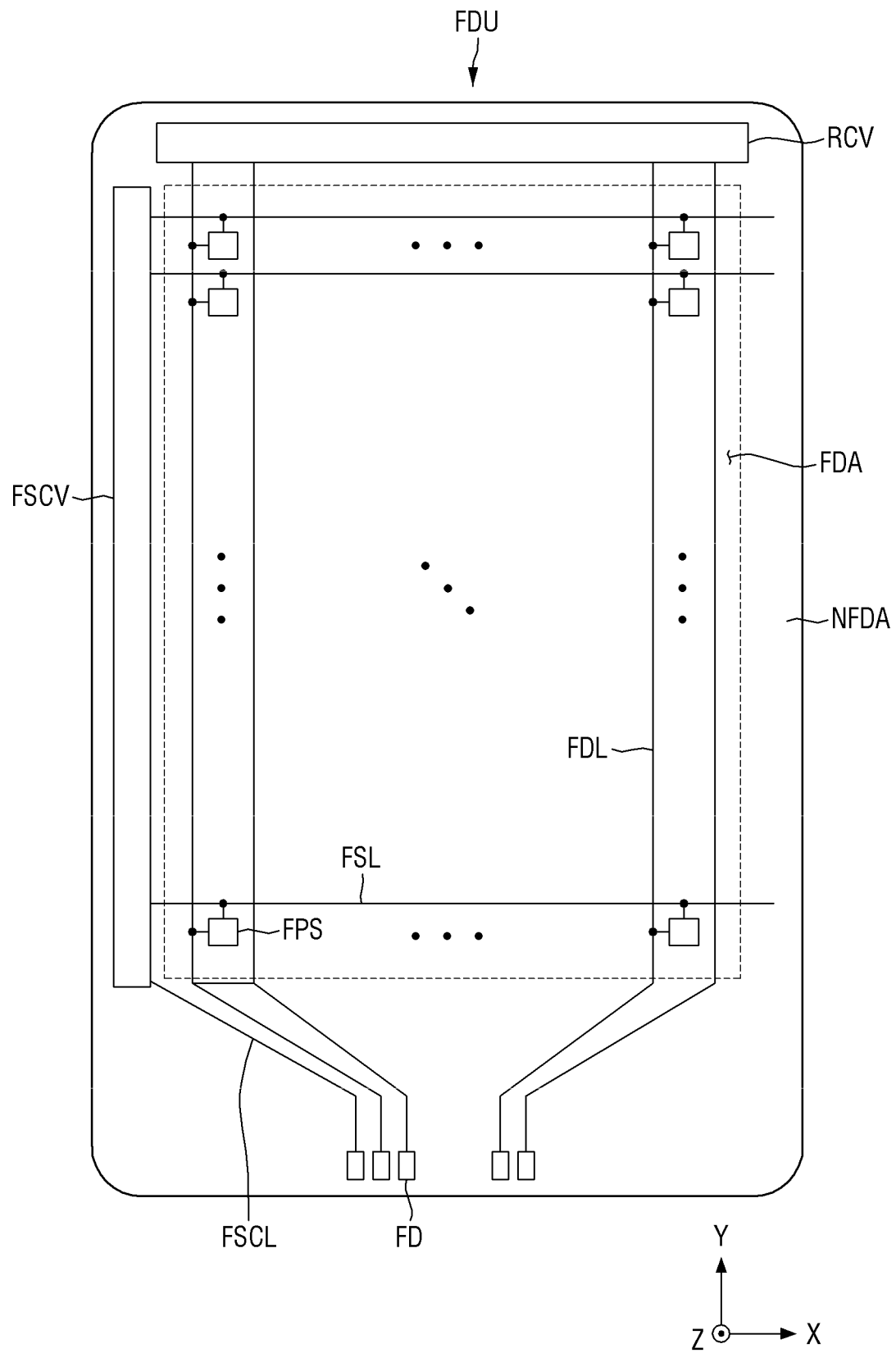
FIG. 5 is an illustrative view showing in detail an example of a fingerprint sensing unit of FIG. 2.

FIG. 5 is an illustrative view showing in detail an example of a fingerprint sensing unit of FIG. 2.

Referring to FIG. 5, the fingerprint sensing unit FDU may include fingerprint scan lines FSL, fingerprint data lines FDL, and the fingerprint recognition sensors FPS. An area in which the fingerprint recognition sensors FPS are disposed may be defined as a fingerprint sensing area FDA. In some embodiments, a separation distance between the fingerprint recognition sensors FPS may 5 µm to 50 µm, and 20 to 30 fingerprint recognition sensors FPS may be disposed in a single image acquisition area.

Each fingerprint scan line FSL may be connected to the corresponding fingerprint recognition sensor FPS among the fingerprint recognition sensors FPS, and each fingerprint data line FDL may be connected to the corresponding fingerprint recognition sensor FPS among the fingerprint recognition sensors FPS.

A non-fingerprint sensing area NFDA may be disposed at an outer side of the fingerprint sensing area FDA. A fingerprint scan driver FSCV to which the fingerprint scan lines FSL are connected may be disposed at one side of the non-fingerprint sensing area NFDA.

A fingerprint data driver RCV to which the fingerprint data lines FDL are connected may be disposed at one side of the non-fingerprint sensing area NFDA. In an embodiment, a signal from an external IC may be applied to the fingerprint data lines FDL even without the fingerprint data driver RCV.

A fingerprint pad FD may be connected to an end of each fingerprint scan line FSL and each fingerprint data line FDL.

The fingerprint pads FD may be formed in the same process as transistors for driving the fingerprint recognition sensors FPS.

A scan signal may be sequentially supplied to the fingerprint scan lines FSL, and the fingerprint data lines FDL may receive signals output from the fingerprint recognition sensors FPS and transmit the received signals to the fingerprint data driver RCV. In an embodiment, the signals output from the fingerprint recognition sensors FPS may be transmitted to another circuit (not illustrated) configured to process the signals.

Figure 6:
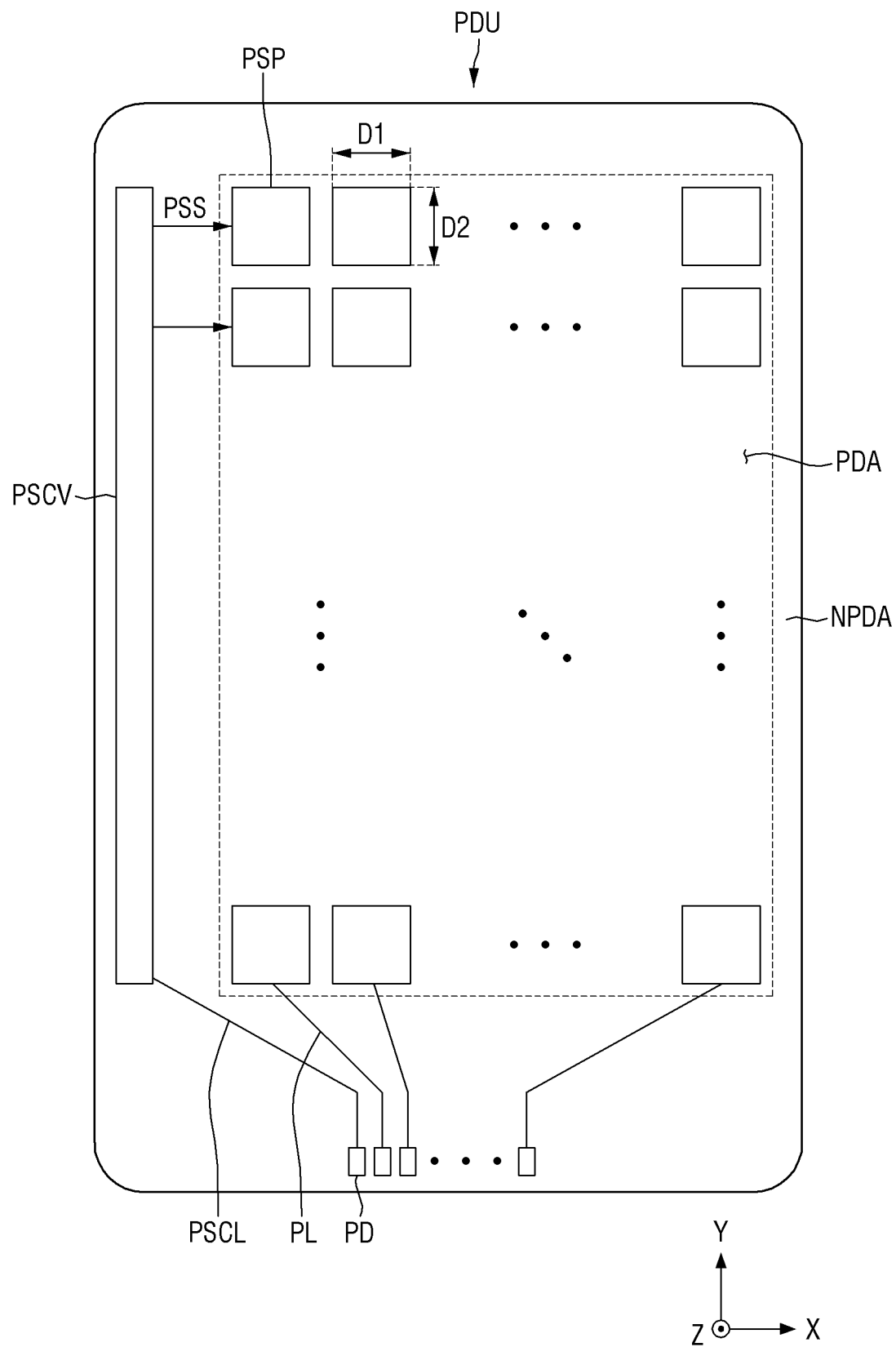
FIG. 6 is an illustrative view showing in detail an example of a pen sensing unit of FIG. 2.
Figure 7:
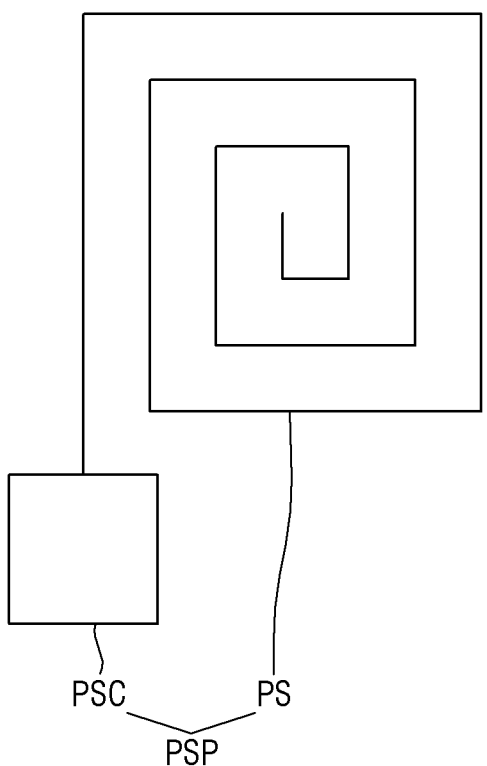
FIG. 7 is a plan view schematically showing a pen sensor member of FIG. 6 according to an embodiment.
Figure 8:
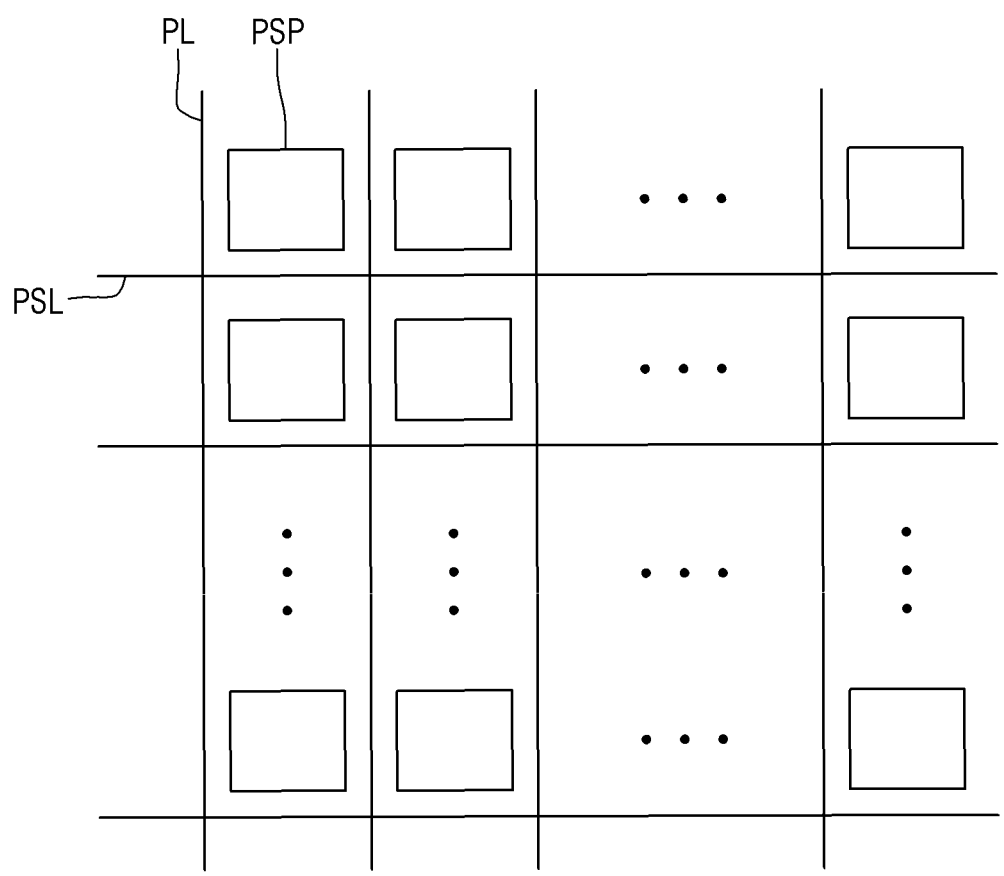
FIG. 8 is a view schematically illustrating the connection relationship of the pen sensor member, a pen scan line, and a pen line according to an embodiment.
Figure 9:
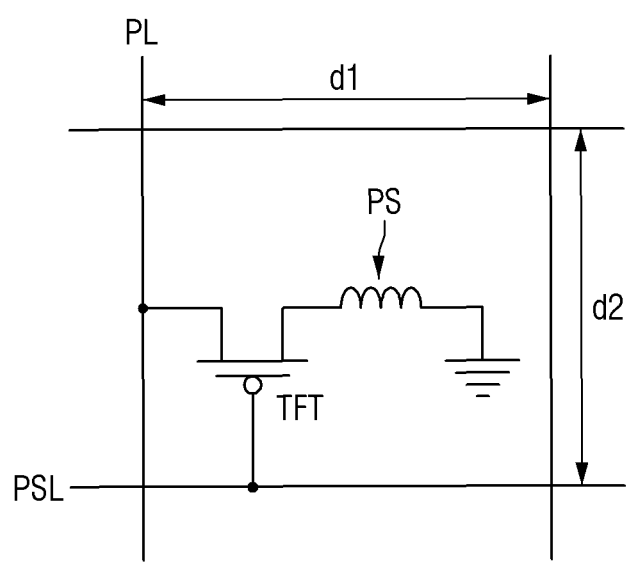
FIG. 9 is a circuit diagram of the pen sensor member of FIG. 8 according to an embodiment.
Figure 10:
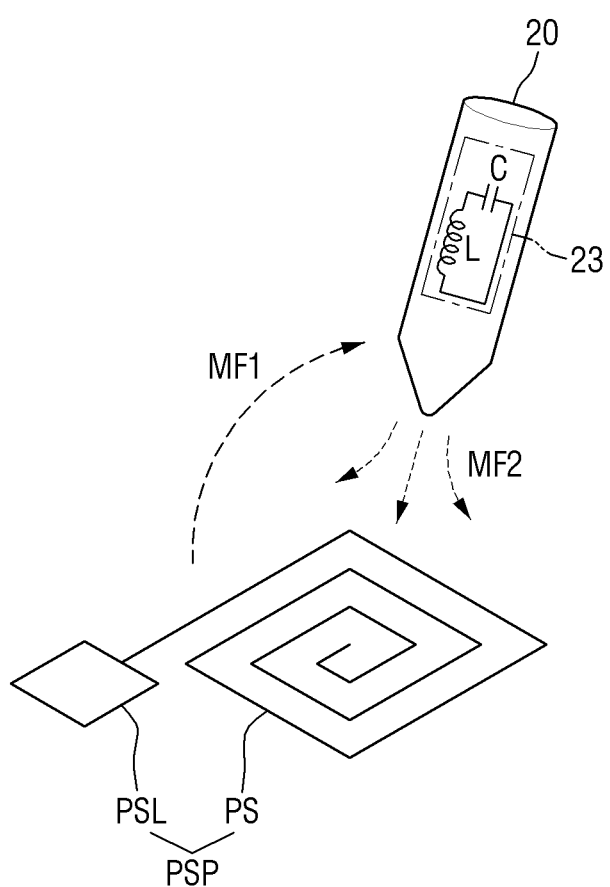
FIG. 10 is a view schematically illustrating a state in which the pen sensor member senses a pen.
Figure 11:
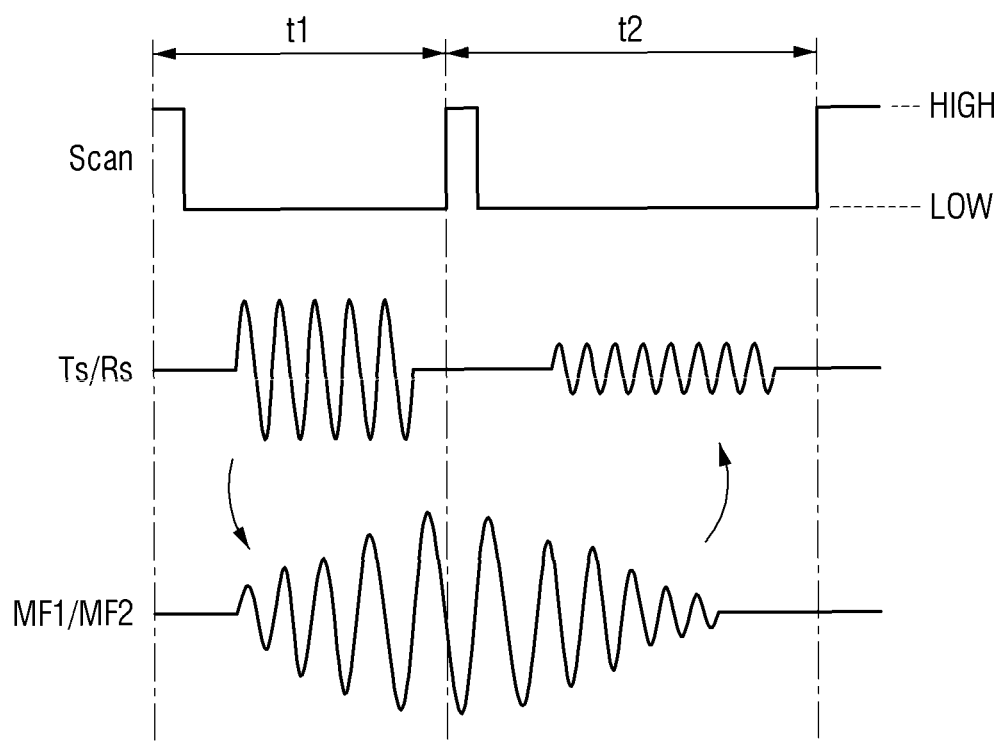
FIG. 11 is a timing diagram for describing an operation of sensing a pen by the pen sensor member according to an embodiment.
Figure 12:
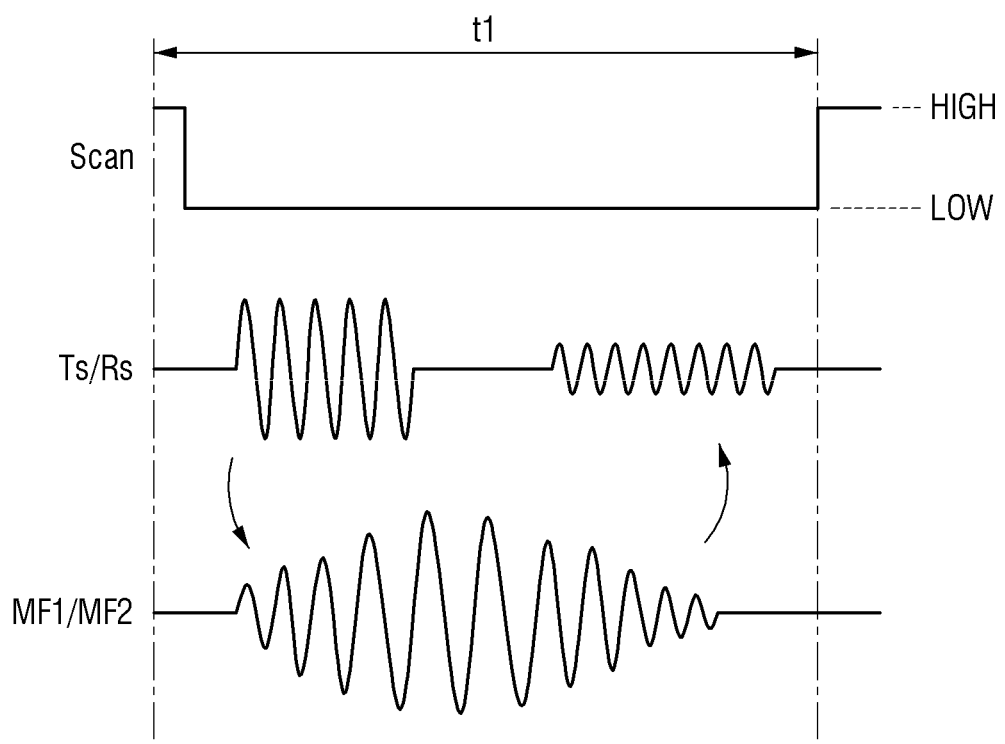
FIG. 12 is a timing diagram for describing an operation of sensing a pen by the pen sensor member according to an embodiment.

FIG. 6 is an illustrative view showing in detail an example of a pen sensing unit of FIG. 2; FIG. 7 is a plan view schematically showing a pen sensor member of FIG. 6 according to an embodiment; FIG. 8 is a view schematically illustrating the connection relationship of the pen sensor member, a pen scan line, and a pen line according to an embodiment; FIG. 9 is a circuit diagram of the pen sensor member of FIG. 8 according to an embodiment; FIG. 10 is a view schematically illustrating a state in which the pen sensor member senses a pen; FIG. 11 is a timing diagram for describing an operation of sensing a pen by the pen sensor member according to an embodiment; and FIG. 12 is a timing diagram for describing an operation of sensing a pen by the pen sensor member according to an embodiment.

Referring to FIGS. 6 to 11, the pen sensing unit PDU may include a pen scan driver PSCV and a pen pad PD which are disposed in a non-pen sensing area NPDA, and pen sensor members PSP disposed in a pen sensing area PDA. The pen sensing area PDA refers to an area for sensing input by pen (e.g. sensing input from a pen), and the non-pen sensing area NPDA refers to an area disposed around the pen sensing area PDA.

The pen sensing area PDA may overlap with the display area DA of the display panel 100, and the non-pen sensing area NPDA may overlap with the non-display area NDA of the display panel 100.

The pen sensor members PSP may be disposed along rows and columns in the form of matrix. A length D1 in the first direction (X-axis direction) and a length D2 in the second direction (Y-axis direction) of each pen sensor member PSP may be 1 mm to 10 mm. In embodiments, the lengths may be changed in various ways according to the size of the pen sensing unit PDU, the arrangement position of the pen sensing unit PDU, and the like.

As illustrated in FIG. 8, pen scan lines PSL and pen lines PL are disposed in the pen sensing area PDA together with the pen sensor members PSP. The pen scan lines PSL may be parallel to each other in the first direction (X-axis direction), and the pen lines PL may be parallel to each other in the second direction (Y-axis direction) intersecting the first direction (X-axis direction). Each pen sensor member PSP may be connected to at least one of the pen scan lines PSL and any one of the pen lines PL. A length d1 between the pen lines PL and a length d2 between the pen scan lines PSL may be 1 mm to 10 mm.

As illustrated in FIG. 7, each pen sensor member PSP may include a pen sensor circuit PSC and a pen sensor PS connected to the pen sensor circuit PSC. The pen sensor circuit PSC may include at least one thin film transistor. The pen sensor PS may have a spirally wound shape. Specifically, the pen sensor PS may have a shape that is wound around a central portion at least one time. Although the pen sensor PS is illustrated in FIG. 7 as being spirally wound in a square shape, in an embodiment, the pen sensor PS may also have a curved shape. In some embodiments, one end of the pen sensor PS may be connected to the pen sensor circuit PSC. The other end of the pen sensor PS may be connected to a reference power source. In some embodiments, the reference power source may be a ground (GND) power source.

The pen sensor PS may be formed of a conductive material such as copper (Cu), aluminum (Al), molybdenum (Mo), and silver (Ag). Since the pen sensor PS is disposed below the pixels P and thus is irrelevant to transmittance of the display device 10, there are almost no limitations on the line width thickness, position, or the like of the pen sensor PS. Since the pen sensor PS is separately disposed for each area, the freedom of design, including low resistance, is given.

As illustrated in FIG. 6, the pen scan driver PSCV is connected to the pen pad PD through at least one pen scan control line PSCL. The pen scan driver PSCV may receive a pen scan control signal. The pen scan driver PSCV generates scan signals Scan according to the pen scan control signal and supplies the generated scan signals to the pen scan lines PSL illustrated in FIG. 8, and the pen scan lines PSL transmit the scan signals Scan to the pen sensor member PSP.

When the scan signal Scan is applied, each pen sensor member PSP receives a driving signal of the pen line PL and receives a sensed signal, thereby detecting whether input by pen has been made and the coordinates of the contact point.

Specifically, referring to FIGS. 9 to 11, the pen sensor member PSP may be connected to the pen scan line PSL and the pen line PL. The pen sensor member PSP may include a thin film transistor TFT and the pen sensor PS. The thin film transistor TFT may be included in the pen sensor circuit PSC (see FIG. 7) as described above.

The thin film transistor TFT is turned on (e.g., switched on) by the scan signal Scan of the pen scan line PSL and connects the pen line PL and one end of the pen sensor PS. A gate electrode of the thin film transistor TFT may be connected to the pen scan line PSL, a first electrode of the thin film transistor TFT may be connected to one end of the pen sensor PS, and a second electrode of the thin film transistor TFT may be connected to the pen line PL.

Driving of the pen sensor member PSP will be described below. First, during a first period t1, a gate-on voltage of the scan signal Scan is supplied to the pen scan line PSL, and the gate-on voltage has a low level LOW. During the first period t1, the thin film transistor TFT is turned on by the scan signal Scan having the gate-on voltage. Due to the thin film transistor TFT being turned on, the pen line PL and the pen sensor PS are connected, and a driving signal Ts is applied to the pen sensor PS.

When the driving signal Ts is applied to the pen sensor PS, a first electromagnetic field MF1 is generated in the pen sensor PS. In this case, when input is made by the pen 20 including the resonance circuit 23 therein, the pen 20 resonates due to the first electromagnetic field MF1, holds a resonant frequency for a predetermined amount of time, and outputs a second electromagnetic field MF2 to the pen sensor PS. After the elapse of the first period t1, the thin film transistor TFT of the pen sensor member PSP is turned off in response to a gate-off voltage of the scan signal Scan. The gate-off voltage has a high level HIGH.

Second, during a second period t2, the scan signal Scan having the gate-on voltage is supplied to the pen scan line PSL. During the second period t2, the thin film transistor TFT is turned on by the scan signal Scan having the gate-on voltage. Due to the thin film transistor TFT being turned on, the pen line PL and the pen sensor PS are connected, and a sensed signal Rs is received through the pen line PL. Since the output of the second electromagnetic field MF2 through the pen 20 occurs throughout the first period t1 and the second period t2, in the second period t2 the pen line PL may detect the second electromagnetic field MF2 sensed by the pen sensor PS and sense contact by the pen 20 and coordinates of the contact point. In some embodiments, as illustrated in FIG. 12, the application of the driving signal Ts and the reception of the sensed signal Rs through the pen line PL may also be performed during the first period t1.

Although description with reference to FIGS. 9 to 12 has been given above assuming that the thin film transistor TFT is formed as a P-type transistor, in an embodiment, the thin film transistor TFT may be formed as an N-type transistor.

Figure 23:
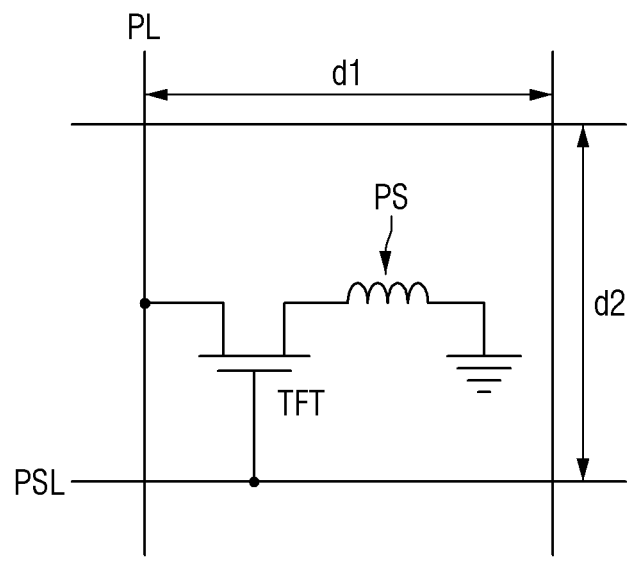
FIG. 23 is a circuit diagram illustrating a modified example of the pen sensor member illustrated in FIG. 9.
Figure 24:
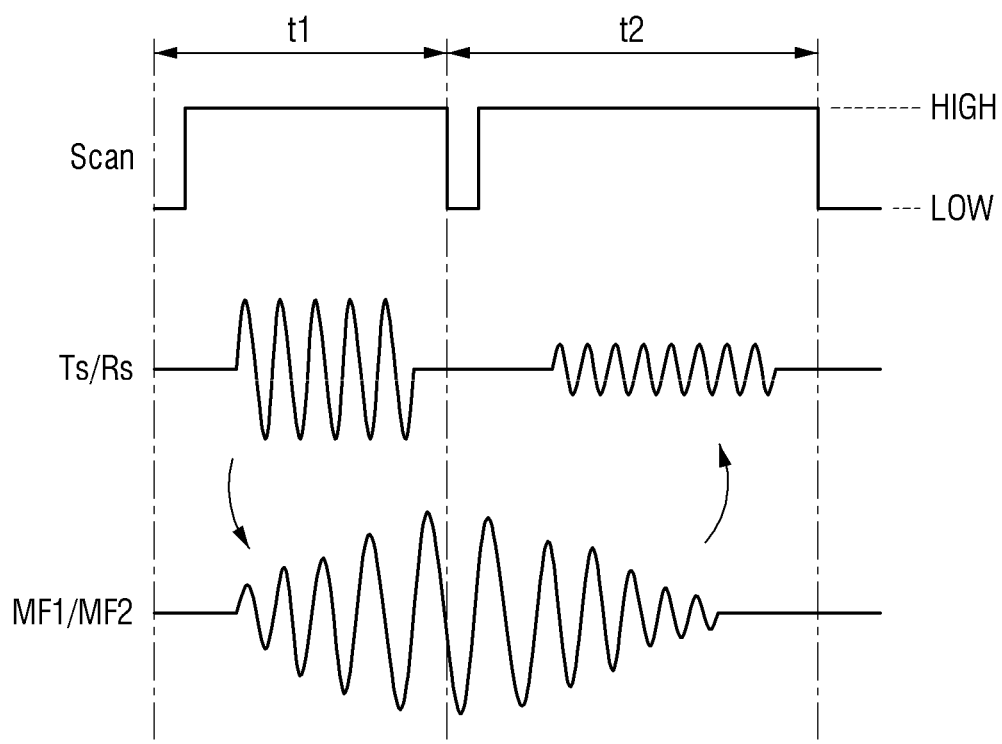
FIG. 24 is a timing diagram for describing an operation of the pen sensor member illustrated in FIG. 23.

FIG. 23 is a circuit diagram illustrating a modified example of the pen sensor member illustrated in FIG. 9; FIG. 24 is a timing diagram for describing an operation of the pen sensor member illustrated in FIG. 23; and FIG. 25 is a timing diagram for describing another operation of the pen sensor member illustrated in FIG. 23.

Figure 25:
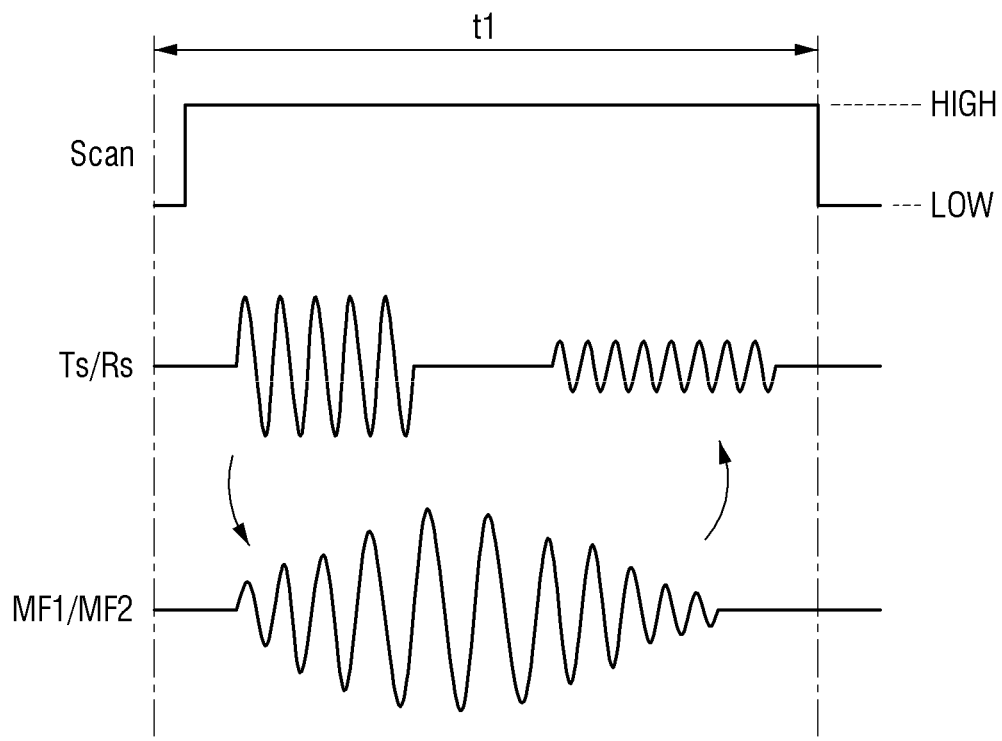
FIG. 25 is a timing diagram for describing another operation of the pen sensor member illustrated in FIG. 23.

Referring to FIGS. 23 to 25 in addition to FIGS. 9 to 12, as illustrated in FIG. 23, the thin film transistor TFT of the pen sensor member may be formed as an N-type transistor. Except for this difference, the structure of the pen sensor member is substantially the same as that illustrated in FIG. 9. Therefore, detailed description of previously described structures will be omitted.

As illustrated in the timing diagrams of FIGS. 24 and 25, a voltage at the high level HIGH may be provided as the gate-on voltage of the scan signal Scan to the pen sensor member illustrated in FIG. 23, and a voltage at the lower level LOW may be provided as the gate-off voltage of the scan signal Scan to the pen sensor member illustrated in FIG. 23. Except for these differences, the operation of the pen sensor member according to the timing diagram illustrated in FIG. 24 and the operation of the pen sensor member according to the timing diagram illustrated in FIG. 25 are the same as or similar to those described above with reference to FIGS. 11 and 12. Therefore, detailed description of previously described structures will be omitted.

Figure 13:
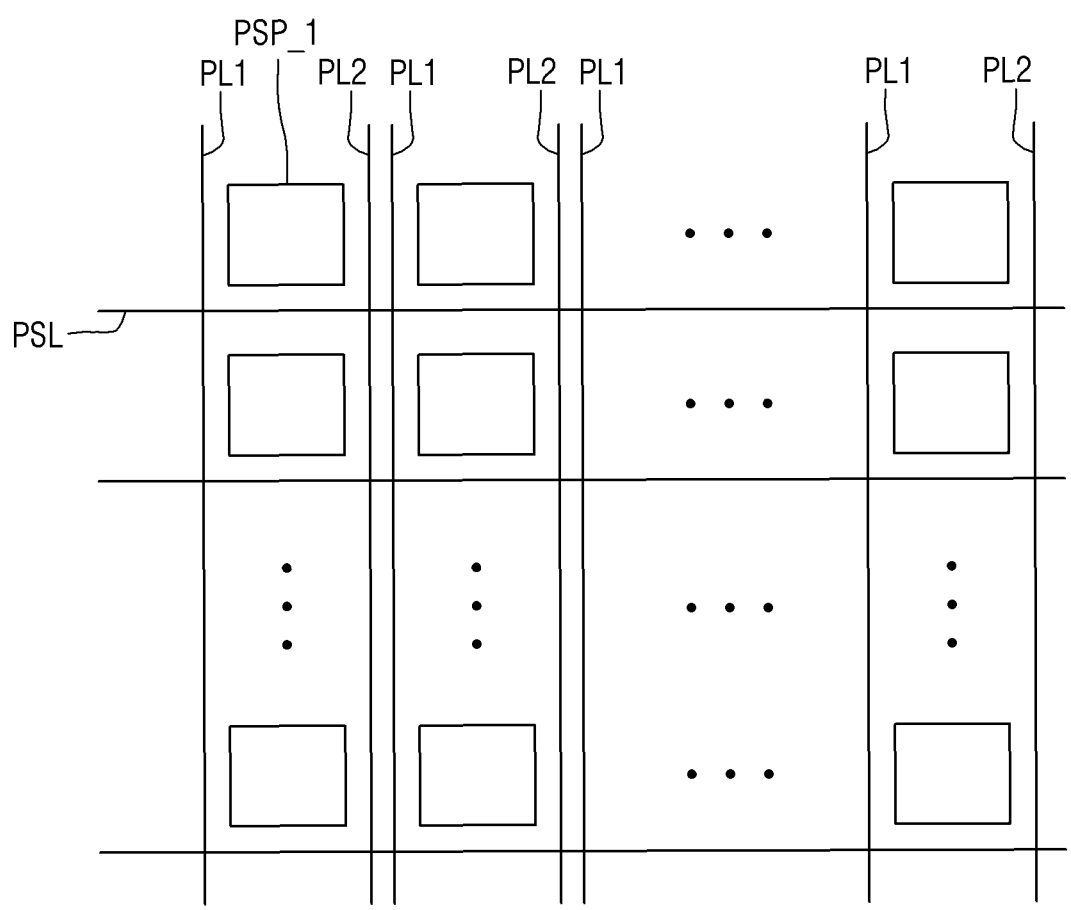
FIG. 13 is a view schematically illustrating the connection relationship of a pen sensor member, a pen scan line, a first pen line, and a second pen line according to an embodiment.
Figure 14:
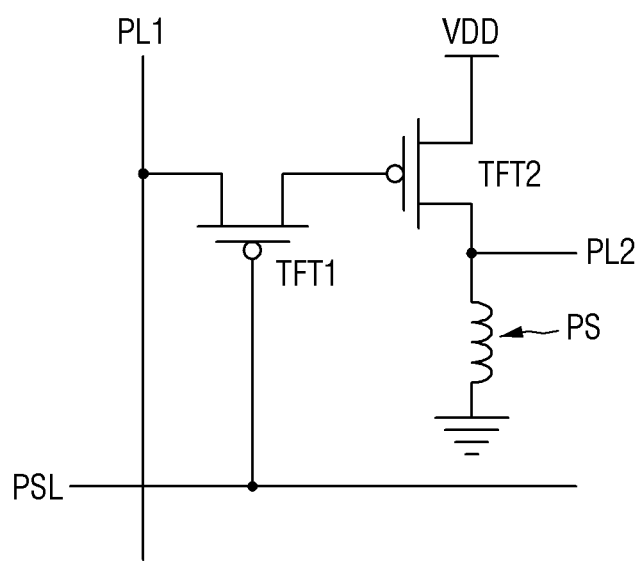
FIG. 14 is a circuit diagram of the pen sensor member of FIG. 13 according to an embodiment.
Figure 15:
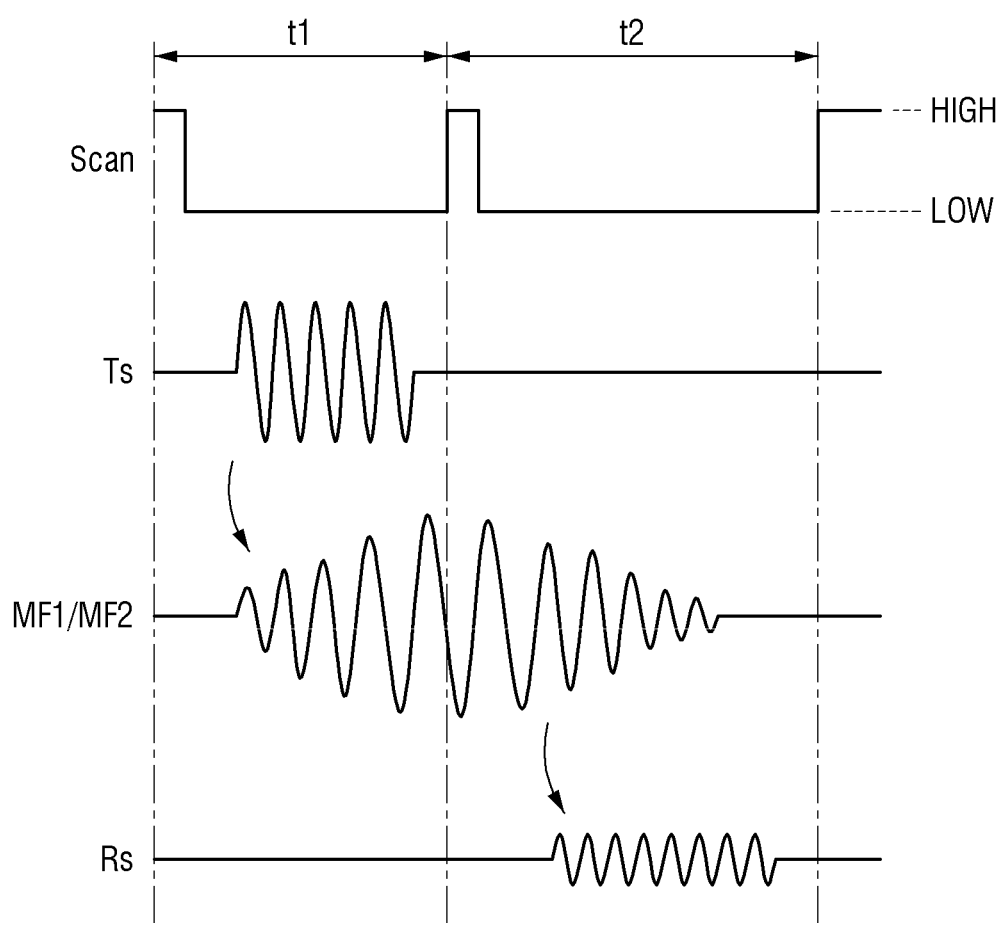
FIG. 15 is a timing diagram for describing an operation of sensing a pen by the pen sensor member according to an embodiment.
Figure 16:
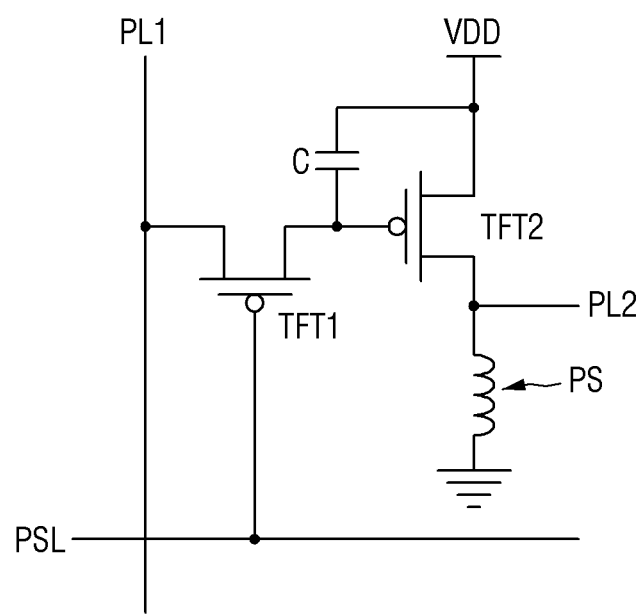
FIG. 16 is a circuit diagram of the pen sensor member of FIG. 13 according to an embodiment.
Figure 17:
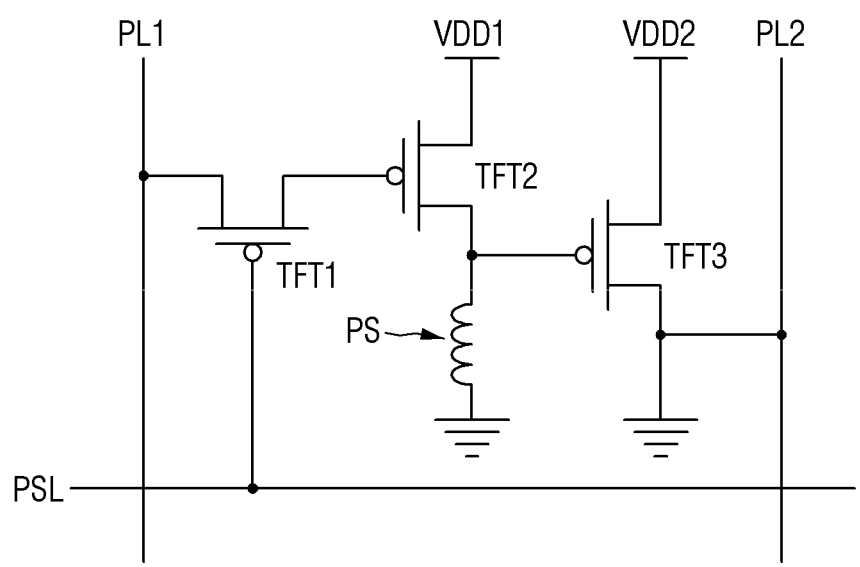
FIG. 17 is a circuit diagram of the pen sensor member of FIG. 13 according to an embodiment.
Figure 18:
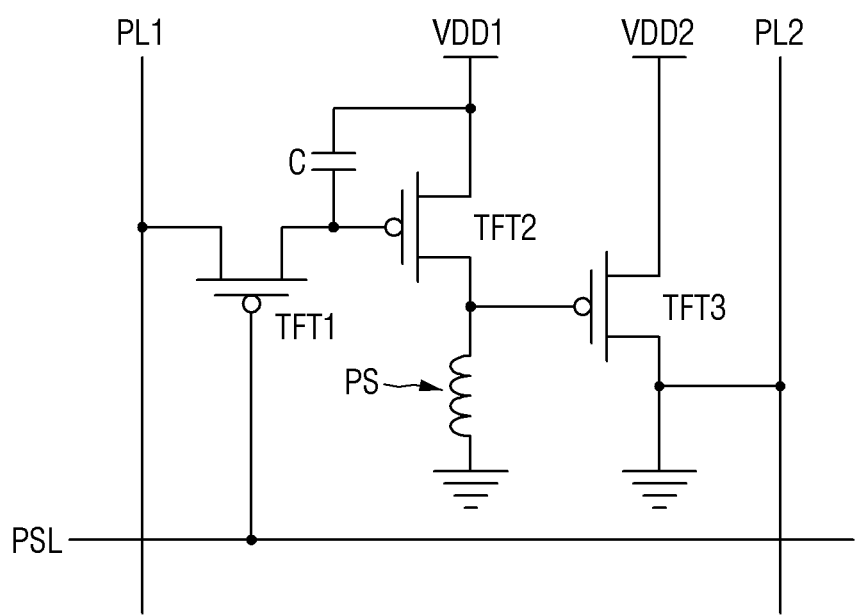
FIG. 18 is a circuit diagram of the pen sensor member of FIG. 13 according to an embodiment.

FIG. 13 is a view schematically illustrating the connection relationship of a pen sensor member, a pen scan line, a first pen line, and a second pen line according to an embodiment; FIG. 14 is a circuit diagram of the pen sensor member of FIG. 13 according to an embodiment; FIG. 15 is a timing diagram for describing an operation of sensing a pen by the pen sensor member according to an embodiment; FIG. 16 is a circuit diagram of the pen sensor member of FIG. 13 according to an embodiment; FIG. 17 is a circuit diagram of the pen sensor member of FIG. 13 according to an embodiment; and FIG. 18 is a circuit diagram of the pen sensor member of FIG. 13 according to an embodiment Referring to FIG. 13, pen sensor members PSP_1 may be disposed along rows and columns in the form of matrix. Pen scan lines PSL, first pen lines PL1, and second pen lines PL2 are disposed in a pen sensing area PDA together with the pen sensor members PSP_1. The pen scan lines PSL may be parallel to each other in a first direction (X-axis direction), and the first pen lines PL1 and the second pen lines PL2 may be parallel to each other in a second direction (Y-axis direction) intersecting the first direction (X-axis direction). Also, the first pen lines PL1 and the second pen lines PL2 may be disposed alternately with each other in the first direction (X-axis direction). Each pen sensor members PSP_1 may be connected to at least one of the pen scan lines PSL, at least one of the first pen lines PL1, and at least one of the second pen lines PL2.

In some embodiments, the first pen lines PL1 may be driving lines configured to transmit a driving signal, and the second pen lines PL2 may be sensing lines configured to receive a sensed signal.

Referring to FIGS. 14 and 15, the pen sensor member PSP_1 may be connected to the pen scan line PSL, the first pen line PL1, and the second pen line PL2. The pen sensor members PSP_1 may include a first thin film transistor TFT1, a second thin film transistor TFT2, and a pen sensor PS. The first thin film transistor TFT1 and the second thin film transistor TFT2 may be included in the pen sensor circuit described above with reference to FIG. 7.

The first thin film transistor TFT1 is turned on by a scan signal Scan of the pen scan line PSL and connects the first pen line PL1 and a gate electrode of the second thin film transistor TFT2. A gate electrode of the first thin film transistor TFT1 may be connected to the pen scan line PSL, a first electrode of the first thin film transistor TFT1 may be connected to the gate electrode of the second thin film transistor TFT2, and a second electrode of the first thin film transistor TFT1 may be connected to the first pen line PL1.

The second thin film transistor TFT2 is turned on by the driving signal Ts of the first pen line PL1 and connects a driving voltage line VDD and the pen sensor PS. The gate electrode of the second thin film transistor TFT2 may be connected to the first electrode of the first thin film transistor TFT1, a first electrode of the second thin film transistor TFT2 may be connected to the second pen line PL2 and the pen sensor PS, and a second electrode of the second thin film transistor TFT2 may be connected to the driving voltage line VDD. The driving voltage line VDD may be a high-potential power source.

One end of the pen sensor PS may be connected to the first electrode of the second thin film transistor TFT2 and the second pen line PL2, and the other end of the pen sensor PS may be connected to a reference power source. In some embodiments, the reference power source may be a GND power source.

In some embodiments, each of the first thin film transistor TFT1 and the second thin film transistor TFT2 may be formed as a P-type transistor.

Driving of the pen sensor member PSP_1 will be described below. First, during a first period t1, a gate-on voltage of the scan signal Scan may be supplied to the pen scan line PSL, and the gate-on voltage may have a low level LOW. During the first period t1, the first thin film transistor TFT1 is turned on by the scan signal Scan having the gate-on voltage. Due to the first thin film transistor TFT1 being turned on, the first pen line PL1 and the gate electrode of the second thin film transistor TFT2 are connected, and, during the first period t1, a driving signal Ts is applied to the first pen line PL1, and the second thin film transistor TFT2 is turned on by the driving signal Ts.

Due to the second thin film transistor TFT2 being turned on, current flows in the pen sensor PS, and the first electromagnetic field MF1 illustrated in FIG. 10 is generated in the pen sensor PS. In this case, when input is made by the pen 20 including the resonance circuit 23 therein, the pen 20 resonates due to the first electromagnetic field MF1, holds a resonant frequency for a predetermined amount of time, and outputs the second electromagnetic field MF2 to the pen sensor PS. After the elapse of the first period t1, a gate-off voltage of the scan signal Scan may be supplied to the first thin film transistor TFT1 of the pen sensor member PSP_1, and the gate-off voltage may have a high level HIGH. As the first thin film transistor TFT1 is turned off, the second thin film transistor TFT2 is also turned off.

Second, during a second period t2, the scan signal Scan having the gate-on voltage is supplied to the pen scan line PSL. During the second period t2, since the driving signal Ts is not applied to the first pen line PL1, the second thin film transistor TFT2 is turned off, and, during the second period t2, a sensed signal Rs is received through the second pen line PL2. Since the output of the second electromagnetic field MF2 through the pen 20 occurs throughout the first period t1 and the second period t2, in the second period t2, the second pen line PL2 may detect the second electromagnetic field MF2 sensed by the pen sensor PS and sense contact by the pen 20 and coordinates of the contact point. In some embodiments, the application of the driving signal Ts through the first pen line PL1 and the reception of the sensed signal Rs through the second pen line PL2 may also be performed during the first period t1. Also, in some embodiments, as illustrated in FIG. 16, a capacitor C may be formed between the driving voltage line VDD and the gate electrode of the second thin film transistor TFT2.

Alternatively, each of the first thin film transistor TFT1 and the second thin film transistor TFT2 may also be formed as an N-type transistor.

Figure 26:
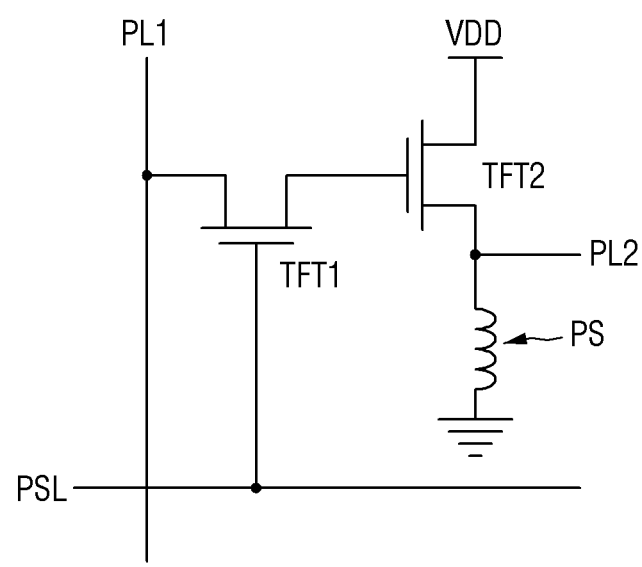
FIG. 26 is a circuit diagram illustrating a modified example of the pen sensor member illustrated in FIG. 14.
Figure 27:
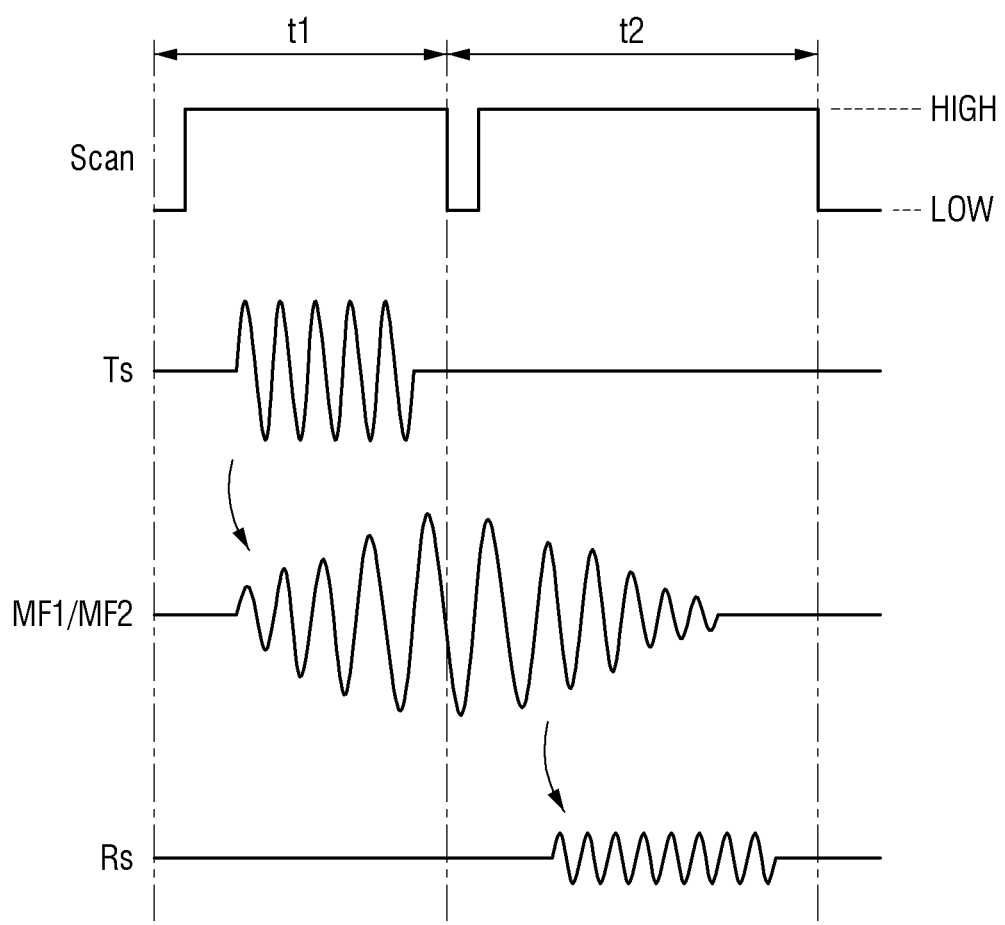
FIG. 27 is a timing diagram for describing an operation of the pen sensor member illustrated in FIG. 26.

FIG. 26 is a circuit diagram illustrating a modified example of the pen sensor member illustrated in FIG. 14; FIG. 27 is a timing diagram for describing an operation of the pen sensor member illustrated in FIG. 26; and FIG. 28 is a circuit diagram illustrating a modified example of the pen sensor member illustrated in FIG. 16.

Figure 28:
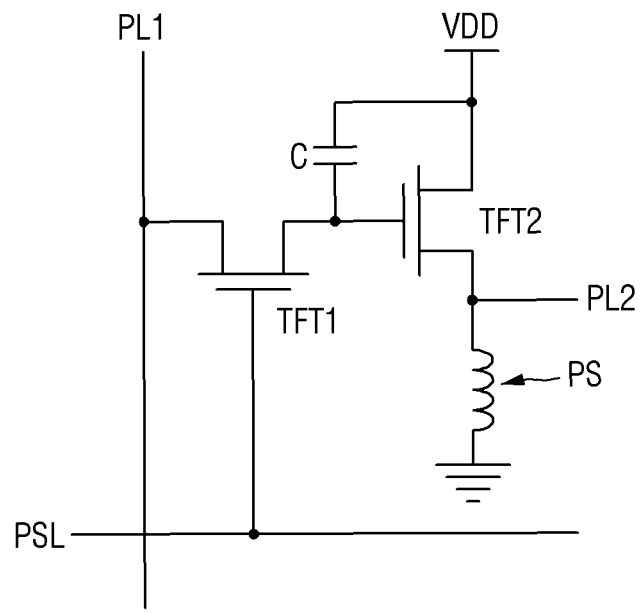
FIG. 28 is a circuit diagram illustrating a modified example of the pen sensor member illustrated in FIG. 16.

Referring to FIGS. 26 to 28 in addition to FIGS. 14 to 16, FIGS. 26 and 28 illustrate the modified example of the pen sensor member illustrated in FIG. 14 and the modified example of the pen sensor member illustrated in FIG. 16, respectively, wherein each of the first thin film transistor TFT1 and the second thin film transistor TFT2 is an N-type transistor. Also, FIG. 27 illustrates the timing diagram relating to the pen sensor member of FIG. 26, wherein a gate-on voltage of the scan signal Scan has a high level HIGH, and a gate-off voltage of the scan signal Scan has a low level LOW. Except for these differences, the operation of the pen sensor member according to the timing diagram illustrated in FIG. 27 is substantially the same as or similar to that described above with reference to FIG. 16. Therefore, detailed description of previously described structures will be omitted.

Referring back to FIGS. 17 and 18, as illustrated in FIG. 17, in some embodiments, the pen sensor member PSP_1 may further include a third thin film transistor TFT3. The first thin film transistor TFT1, the second thin film transistor TFT2, and the third thin film transistor TFT3 may be included in the pen sensor circuit described above with reference to FIG. 7.

The third thin film transistor TFT3 is turned on by a sensed signal Rs which is sensed by the second electromagnetic field MF2 and connects a second driving voltage line VDD2, the reference power source, and the second pen line PL2. The second driving voltage line VDD2 may be physically spaced apart from the first driving voltage line VDD1. A gate electrode of the third thin film transistor TFT3 may be connected to the first electrode of the second thin film transistor TFT2, a first electrode of the third thin film transistor TFT3 may be connected to the reference power source and the second pen line PL2, and a second electrode of the third thin film transistor TFT3 may be connected to the second driving voltage line VDD2. The third thin film transistor TFT3 allows amplification of the sensed signal Rs, which is advantageous because it may further improve sensitivity of the pen sensing unit PDU. Also, in some embodiments, as illustrated in FIG. 18, a capacitor C may be formed between the first driving voltage line VDD1 and the gate electrode of the second thin film transistor TFT2.

In embodiments, as illustrated in FIGS. 17 and 18, each of the first thin film transistor TFT1, the second thin film transistor TFT2, and the third thin film transistor TFT3 may be formed as a P-type transistor.

Figure 29:
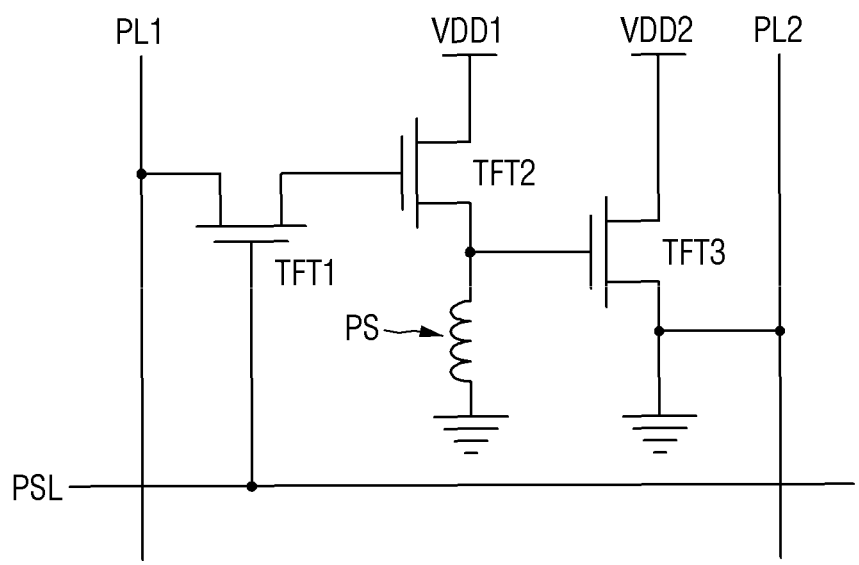
FIG. 29 is a circuit diagram illustrating a modified example of the pen sensor member illustrated in FIG. 17.
Figure 30:
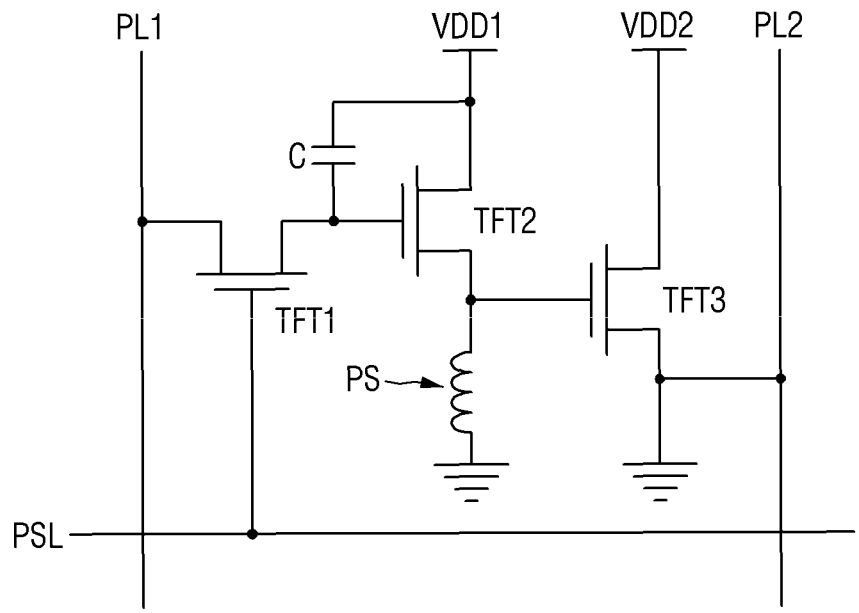
FIG. 30 is a circuit diagram illustrating a modified example of the pen sensor member illustrated in FIG. 18.

FIG. 29 is a circuit diagram illustrating a modified example of the pen sensor member illustrated in FIG. 17, and FIG. 30 is a circuit diagram illustrating a modified example of the pen sensor member illustrated in FIG. 18. Referring to FIGS. 29 and 30 in addition to FIGS. 17 and 18, each of the first thin film transistor TFT1, the second thin film transistor TFT2, and the third thin film transistor TFT3 may also be formed as an N-type transistor. Except for this difference, the structure and operation of the pen sensor member illustrated in FIGS. 29 and 30 are substantially the same as or similar to those described above in the embodiment shown in FIGS. 17 and 18. Therefore, detailed description of previously described structures will be omitted.

Figure 31:
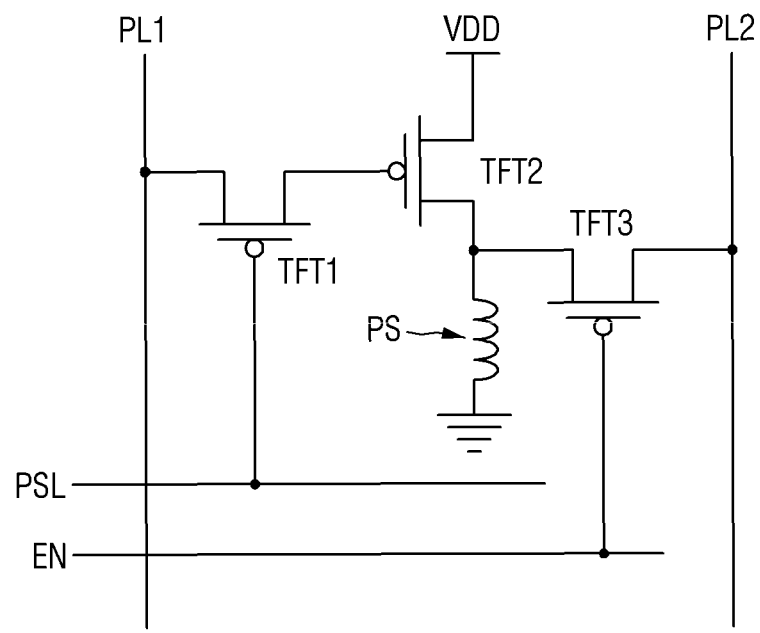
FIGS. 31 and 32 are circuit diagrams of the pen sensor member illustrated in FIG. 13 according to still an embodiment.
Figure 32:
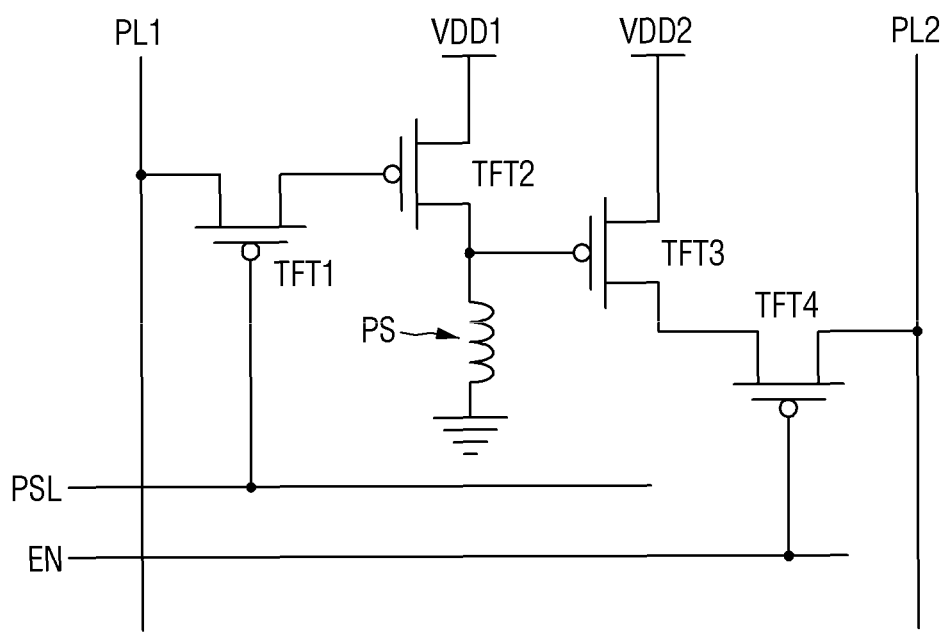
Figure 33:
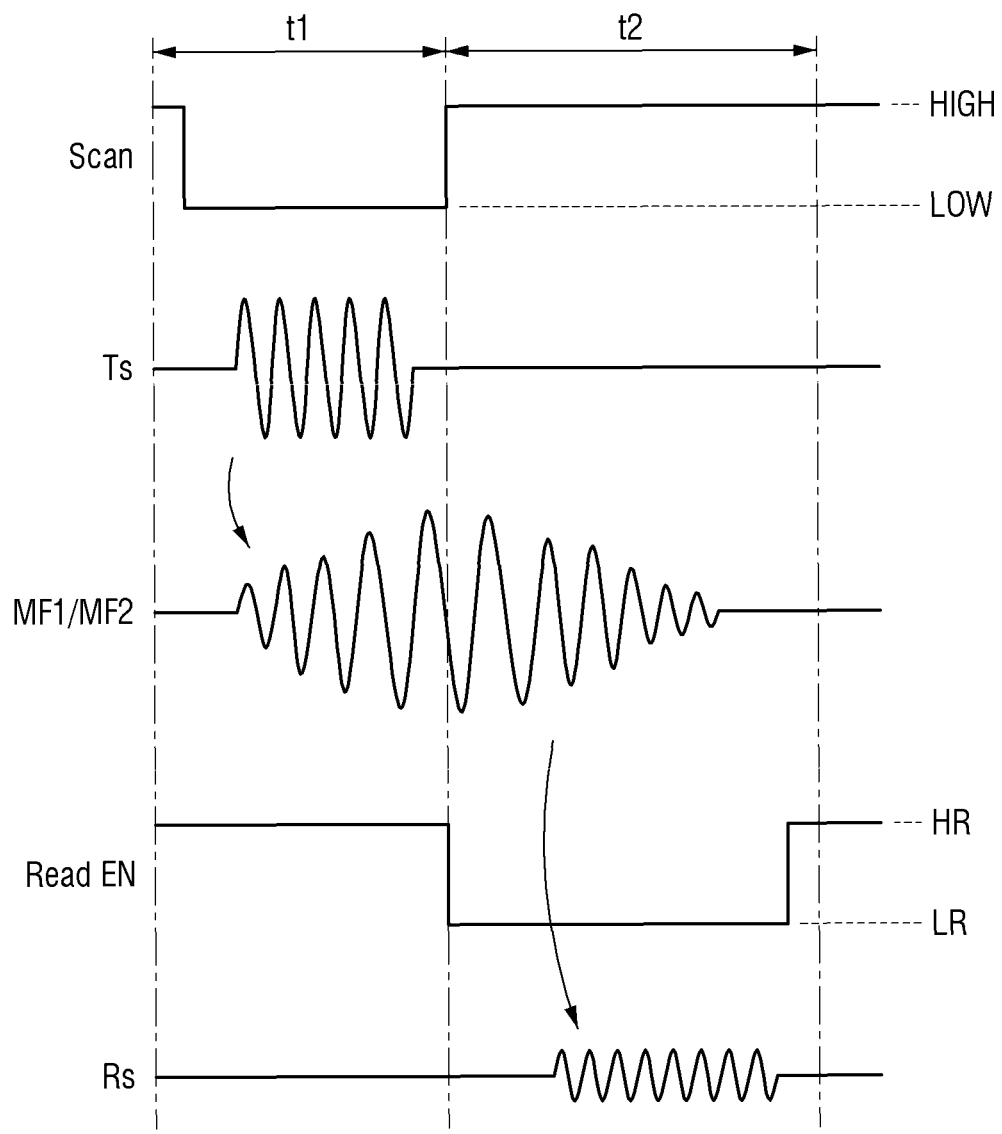
FIG. 33 is a timing diagram for describing an operation of the pen sensor member illustrated in FIGS. 31 and 32.

FIGS. 31 and 32 are circuit diagrams of the pen sensor member illustrated in FIG. 13 according to still an embodiment; and FIG. 33 is a timing diagram for describing an operation of the pen sensor member illustrated in FIGS. 31 and 32.

Referring to FIG. 31, the most significant difference of the pen sensor member according to the present embodiment from the embodiment illustrated in FIG. 16 is that the pen sensor member further includes a third thin film transistor TFT3. Other configurations of the pen sensor member are substantially the same as the embodiment illustrated in FIG. 16. Therefore, previously described descriptions will be omitted.

A first electrode of the third thin film transistor TFT3 may be connected to the pen sensor PS. A second electrode of the third thin film transistor TFT3 may be connected to the second pen line PL2, and a gate electrode of the third thin film transistor TFT3 may be connected to a sensing control line EN to which a sensing control signal is provided.

In some embodiments, the third thin film transistor TFT3 may be a P-type transistor.

Referring to FIG. 32, the most significant difference of the pen sensor member according to the present embodiment from the embodiment illustrated in FIG. 17 is that the pen sensor member further includes a fourth thin film transistor TFT4. Other configurations of the pen sensor member are substantially the same as the embodiment illustrated in FIG. 17. Therefore, previously described descriptions will be omitted.

A first electrode of the fourth thin film transistor TFT4 may be connected to the second electrode of the third thin film transistor TFT3. A second electrode of the fourth thin film transistor TFT4 may be connected to the second pen line PL2, and a gate electrode of the fourth thin film transistor TFT4 may be connected to a sensing control line EN to which a sensing control signal is provided.

In some embodiments, the fourth thin film transistor TFT4 may be a P-type transistor.

FIG. 33 is a timing diagram for describing an operation of the pen sensor member illustrated in FIGS. 31 and 32.

Referring to FIGS. 31 and 33, an operation of the pen sensor member illustrated in FIG. 31 during a first period t1 may be as follows. During the first period t1, a gate-on voltage of a scan signal Scan may be supplied to the pen scan line PSL, and the gate-on voltage may have a low level LOW. During the first period t1, the first thin film transistor TFT1 is turned on by the scan signal Scan having the gate-on voltage. Due to the first thin film transistor TFT1 being turned on, the first pen line PL1 and the gate electrode of the second thin film transistor TFT2 are connected, and, during the first period t1, a driving signal Ts is applied to the first pen line PL1, and the second thin film transistor TFT2 is turned on by the driving signal Ts.

Due to the second thin film transistor TFT2 being turned on, current flows in the pen sensor PS, and a first electromagnetic field MF1 is generated in the pen sensor PS. In this case, when input is made by a pen including a resonance circuit therein, the pen resonates due to the first electromagnetic field MF1, holds a resonant frequency for a predetermined amount of time, and outputs a second electromagnetic field MF2 to the pen sensor PS.

After the elapse of the first period t1, a gate-off voltage of the scan signal Scan may be supplied to the first thin film transistor TFT1, and the gate-off voltage may have a high level HIGH. As the first thin film transistor TFT1 is turned off, the second thin film transistor TFT2 is also turned off.

During a second period t2, the second thin film transistor TFT2 is turned off, and a sensed signal Rs is provided to the first electrode of the third thin film transistor TFT3.

During the first period t1, a turn-off signal having a second high level HR is provided as a sensing control signal Read EN to the gate electrode of the third thin film transistor TFT3, and, accordingly, the third thin film transistor TFT3 maintains the turned-off state during the first period t1. During the second period t2, a turn-on signal having a second low level LR is provided as a sensing control signal Read EN to the gate electrode of the third thin film transistor TFT3. Accordingly, the third thin film transistor TFT3 is turned on during the second period t2, and a sensed signal Rs provided to the first electrode of the third thin film transistor TFT3 is provided to the second pen line PL2 via the second electrode of the third thin film transistor TFT3.

In the case of the present embodiment, there is an advantage that it is possible to control a sensing timing using a separate sensing control signal Read EN.

Referring to FIGS. 32 and 33, the operations of the first thin film transistor TFT1 and the second thin film transistor TFT2 of the pen sensor member illustrated in FIG. 32 during the first period t1 may be substantially the same as the operation of the pen sensor member according to the embodiment of FIG. 31 described above.

During the second period t2, a sensed signal Rs sensed by the second electromagnetic field MF2 may be provided to the gate electrode of the third thin film transistor TFT3, and, accordingly, the third thin film transistor TFT3 may be turned on. As the third thin film transistor TFT3 is turned on, the second driving voltage line VDD2 and the first electrode of the fourth thin film transistor TFT4 may be connected, and the amplified sensed signal Rs may be provided to the fourth thin film transistor TFT4.

During the first period t1, a turn-off signal having the second high level HR is provided as a sensing control signal Read EN to the gate electrode of the fourth thin film transistor TFT4, and, accordingly, the fourth thin film transistor TFT4 maintains the turned-off state during the first period t1. During the second period t2, a sensing control signal Read EN having the second low level LR is provided as a turn-on signal to the gate electrode of the fourth thin film transistor TFT4. Accordingly, the fourth thin film transistor TFT4 may be turned on, and the amplified sensed signal Rs provided to the first electrode of the fourth thin film transistor TFT4 may be provided to the second pen line PL2 via the second electrode of the fourth thin film transistor TFT4.

In this way, when the third thin film transistor TFT3 is further disposed, since it is possible to amplify the sensed signal Rs, there is an advantage that the sensitivity of a sensor is improved. By further disposing the fourth thin film transistor TFT4 and controlling turning-on and turning-off of the fourth thin film transistor TFT4 using the sensing control signal Read EN, it is possible to control a sensing timing.

Figure 34:
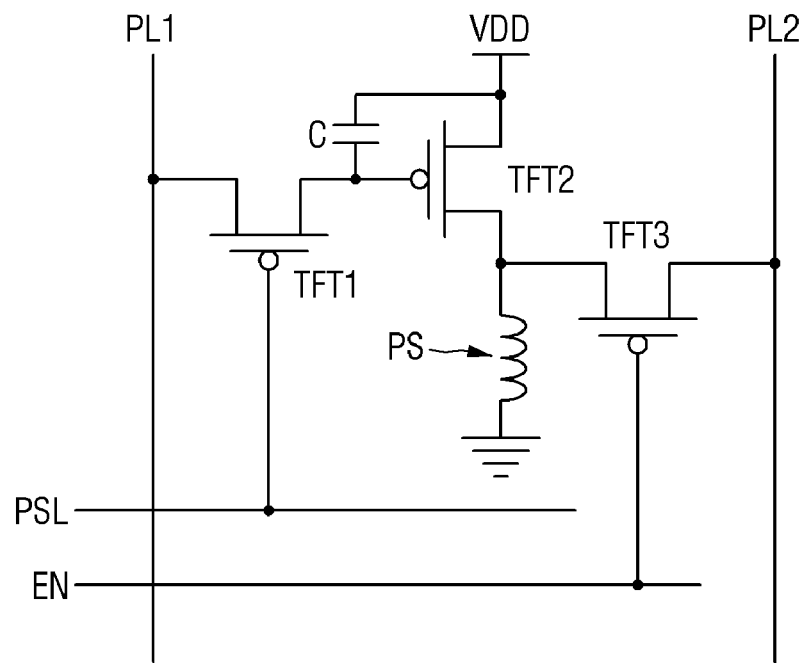
FIGS. 34 and 35 are circuit diagrams illustrating modified examples of the pen sensor member illustrated in FIGS. 31 and 32.
Figure 35:
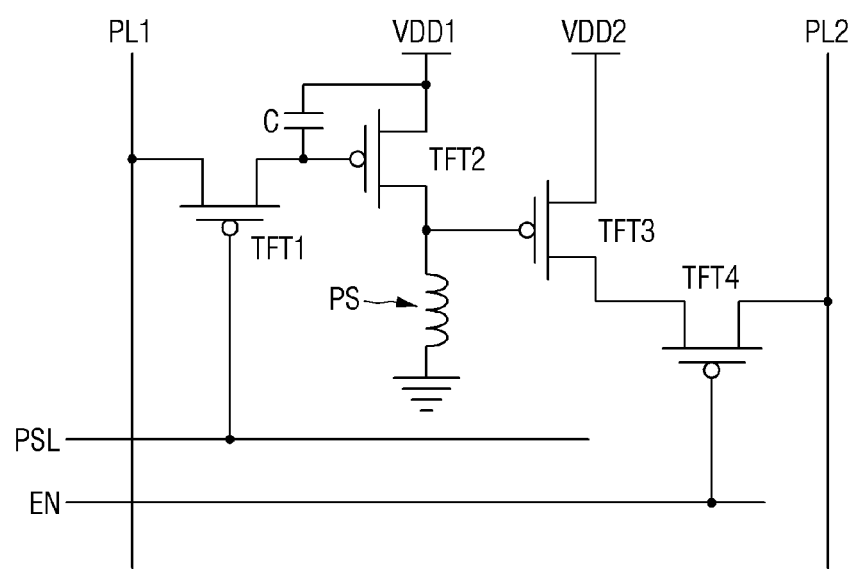

FIGS. 34 and 35 are circuit diagrams illustrating modified examples of the pen sensor member illustrated in FIGS. 31 and 32.

Referring to FIGS. 34 and 35, the embodiment of FIG. 34 is different from the embodiment of FIG. 31 in that a capacitor C is further formed between the driving voltage line VDD and the gate electrode of the second thin film transistor TFT2, and other configurations of the embodiment of FIG. 34 may be substantially the same as the embodiment of FIG. 31. Also, the embodiment of FIG. 35 is different from the embodiment of FIG. 32 in that a capacitor C is further formed between the first driving voltage line VDD1 and the gate electrode of the second thin film transistor TFT2, and other configurations of the embodiment of FIG. 35 may be substantially the same as the embodiment of FIG. 32. Therefore, previously described descriptions will be omitted.

Figure 36:
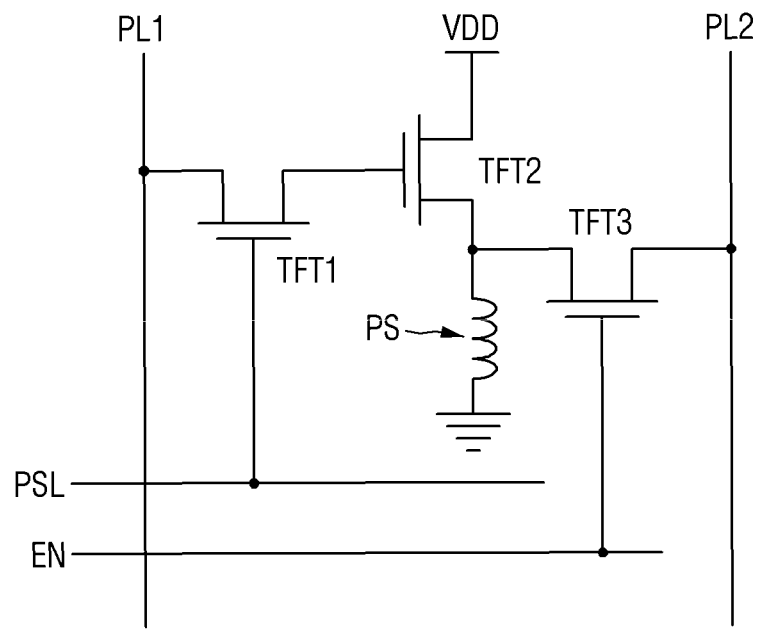
FIGS. 36 and 37 are circuit diagrams illustrating other modified examples of the pen sensor member illustrated in FIGS. 31 and 32.
Figure 37:
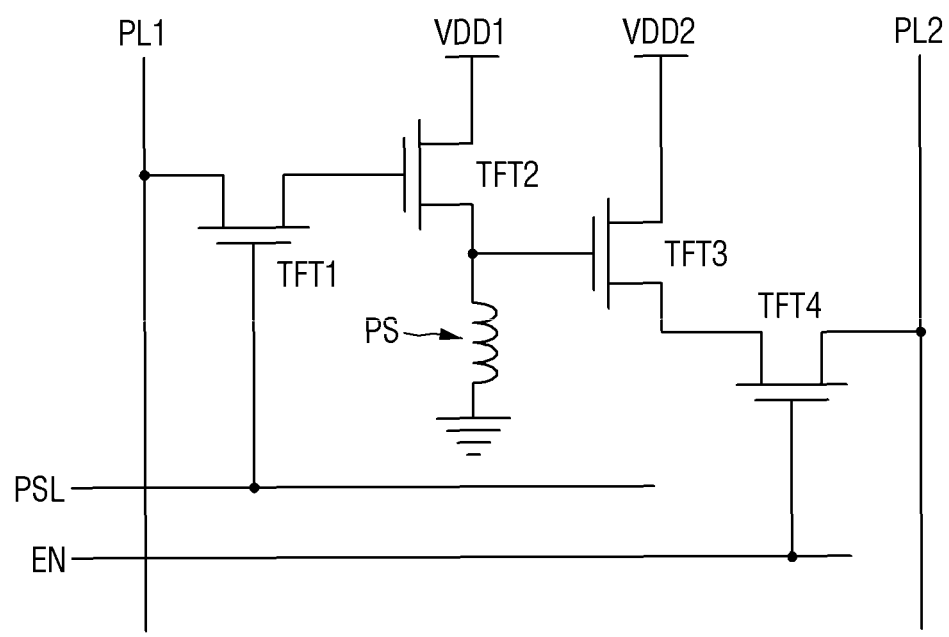
Figure 38:
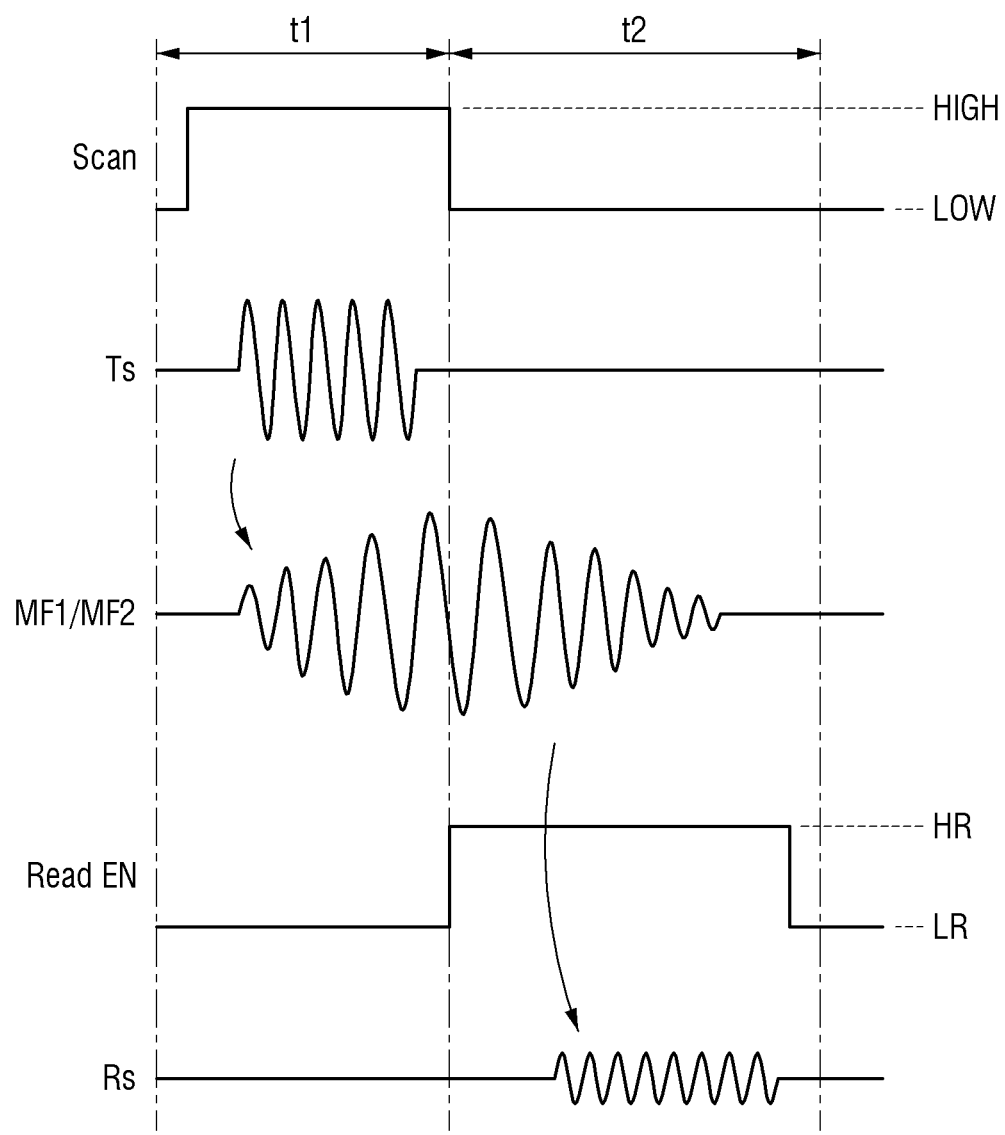
FIG. 38 is a timing diagram for describing an operation of the pen sensor member illustrated in FIGS. 36 and 37.

FIGS. 36 and 37 are circuit diagrams illustrating other modified examples of the pen sensor member illustrated in FIGS. 31 and 32; and FIG. 38 is a timing diagram for describing an operation of the pen sensor member illustrated in FIGS. 36 and 37.

Referring to FIGS. 36 to 38, the embodiment of FIG. 36 is different from the embodiment of FIG. 31 in that each of the first thin film transistor TFT1, the second thin film transistor TFT2, and the third thin film transistor TFT3 is formed as an N-type transistor, and other configurations of the embodiment of FIG. 36 may be substantially the same as the embodiment of FIG. 31. Also, the embodiment of FIG. 37 is different from the embodiment of FIG. 32 in that each of the first thin film transistor TFT1, the second thin film transistor TFT2, the third thin film transistor TFT3, and the fourth thin film transistor TFT4 is formed as an N-type transistor, and other configurations of the embodiment of FIG. 37 may be substantially the same as the embodiment of FIG. 32.

In addition, the timing diagram illustrated in FIG. 38 is different from the timing diagram of FIG. 33 in that the gate-on voltage of the scan signal Scan has the high level HIGH, the gate-off voltage of the scan signal Scan has the low level LOW, the turn-on signal of the sensing control signal Read EN which turns on the fourth thin film transistor TFT4 has the second high level HR, and the turn-off signal of the sensing control signal Read EN which turns off the fourth thin film transistor TFT4 has the second low level LR. Except for these, the operation according to the timing diagram illustrated in FIG. 38 is substantially the same as or similar to that according to the timing diagram of FIG. 33. Therefore, detailed description of previously described structures will be omitted.

Figure 39:
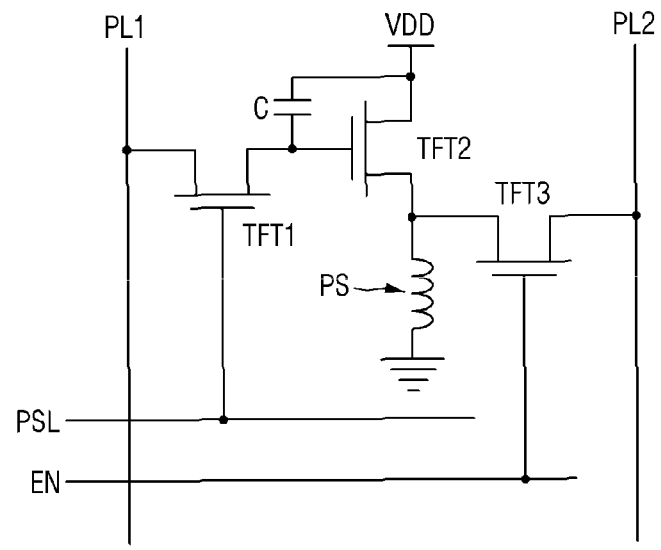
FIGS. 39 and 40 are circuit diagrams illustrating modified examples of the pen sensor member illustrated in FIGS. 36 and 37.
Figure 40:
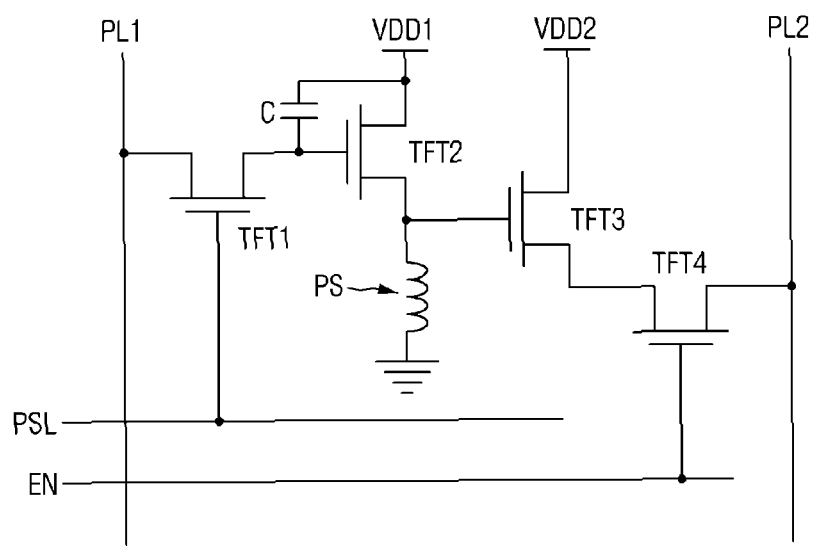

FIGS. 39 and 40 are circuit diagrams illustrating modified examples of the pen sensor member illustrated in FIGS. 36 and 37.

Referring to FIGS. 39 and 40, the embodiment of FIG. 39 is different from the embodiment of FIG. 36 in that a capacitor C is further formed between the driving voltage line VDD and the gate electrode of the second thin film transistor TFT2, and other configurations of the embodiment of FIG. 39 may be substantially the same as the embodiment of FIG. 36. Also, the embodiment of FIG. 40 is different from the embodiment of FIG. 37 in that a capacitor C is further formed between the first driving voltage line VDD1 and the gate electrode of the second thin film transistor TFT2, and other configurations of the embodiment of FIG. 40 may be substantially the same as the embodiment of FIG. 37. Therefore, previously described descriptions will be omitted.

Figure 41:
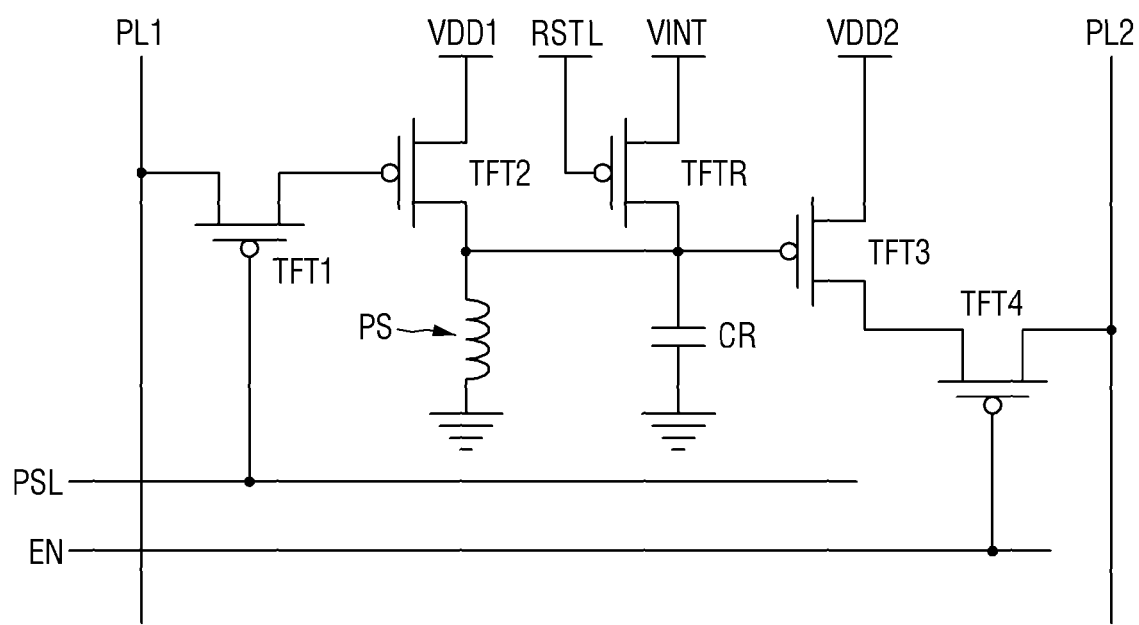
FIG. 41 is a circuit diagram of the pen sensor member illustrated in FIG. 13 according to still an embodiment.
Figure 42:
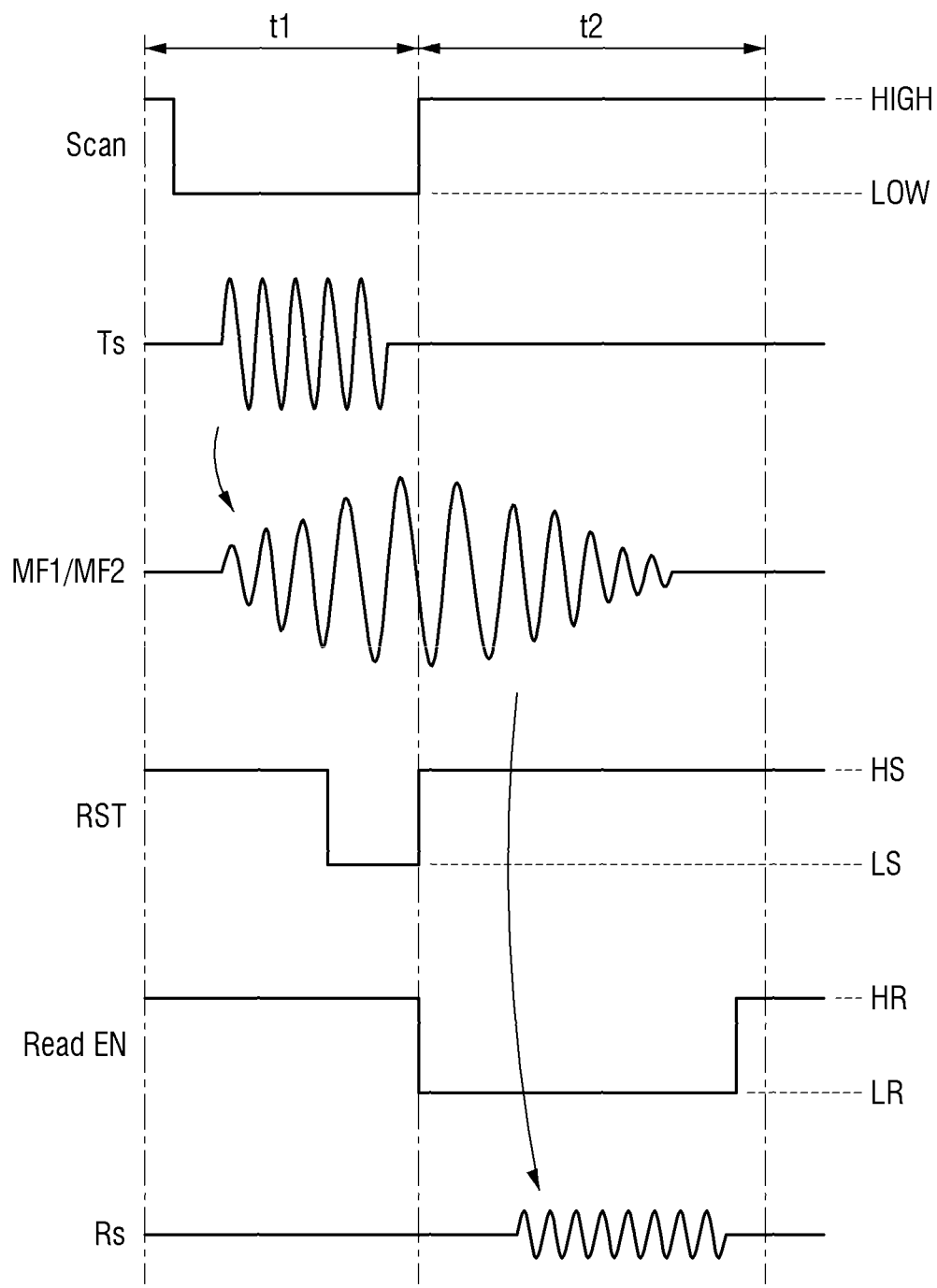
FIG. 42 is a timing diagram for describing an operation of the pen sensor member illustrated in FIG. 41.

FIG. 41 is a circuit diagram of the pen sensor member illustrated in FIG. 13 according to still an embodiment, and FIG. 42 is a timing diagram for describing an operation of the pen sensor member illustrated in FIG. 41.

Referring to FIG. 41, the most significant difference of the pen sensor member according to the present embodiment from the embodiment of FIG. 32 is that the pen sensor member further includes a reset thin film transistor TFTR and a capacitor CR, and other configurations of the pen sensor member may be substantially the same as or similar to the embodiment of FIG. 32. Therefore, previously described descriptions will be omitted.

A gate electrode of the reset thin film transistor TFTR may be connected to a reset signal line RSTL to which a reset signal is provided, a first electrode of the reset thin film transistor TFTR may be connected to an initialization voltage line VINT to which an initialization voltage is provided, and a second electrode of the reset thin film transistor TFTR may be connected to the gate electrode of the third thin film transistor TFT3 and the pen sensor PS.

In some embodiments, the reset thin film transistor TFTR may be a P-type transistor.

A first electrode of the capacitor CR may be connected to the second electrode of the reset thin film transistor TFTR, the gate electrode of the third thin film transistor TFT3, and the pen sensor PS, and a second electrode of the capacitor CR may be connected to a reference power source.

Referring to FIGS. 41 and 42, an operation of the pen sensor member illustrated in FIG. 41 may be as follows.

During a first period t1, a gate-on voltage of a scan signal Scan may be supplied to the pen scan line PSL. The gate-on voltage may have the low level LOW. During the first period t1, the first thin film transistor TFT1 is turned on by the scan signal Scan having the gate-on voltage. Turning the first thin film transistor TFT1 on connects the first pen line PL1 and the gate electrode of the second thin film transistor TFT2. Accordingly, during the first period t1, a driving signal Ts is applied to the first pen line PL1, and the second thin film transistor TFT2 is turned on by the driving signal Ts.

With the second thin film transistor TFT2 turned on, current flows in the pen sensor PS, and the first electromagnetic field MF1 is generated in the pen sensor PS. In this case, when input is made by a pen including a resonance circuit therein, the pen resonates due to the first electromagnetic field MF1, holds a resonant frequency for a predetermined amount of time, and outputs the second electromagnetic field MF2 to the pen sensor PS.

During the first period t1, a voltage or signal having a third low level LS may be provided as a reset signal RST to the reset thin film transistor TFTR, and, accordingly, the reset thin film transistor TFTR may be turned on. As the reset thin film transistor TFTR is turned on, the initialization voltage provided to the initialization voltage line VINT may be provided to the capacitor CR, and, accordingly, a potential of the first electrode of the capacitor CR, a potential of the gate electrode of the third thin film transistor TFT3, and the like may be reset by the initialization voltage.

During a second period t2, a sensed signal Rs sensed by the second electromagnetic field MF2 or a sensed signal Rs stored in the capacitor CR may be provided to the gate electrode of the third thin film transistor TFT3, and, accordingly, the third thin film transistor TFT3 may be turned on. As the third thin film transistor TFT3 is turned on, the second driving voltage line VDD2 and the first electrode of the fourth thin film transistor TFT4 may be connected, and the amplified sensing signal Rs may be provided to the fourth thin film transistor TFT4. Also, during the second period t2, a sensed signal Rs may be provided to the capacitor CR, and, accordingly, the sensed signal Rs may be stably maintained during the second period t2. That is, the capacitor CR may serve as a maintaining capacitor which maintains the sensed signal Rs during the second period t2.

During the first period t1, a turn-off signal having the second high level HR is provided as a sensing control signal Read EN to the gate electrode of the fourth thin film transistor TFT4. Accordingly, the fourth thin film transistor TFT4 maintains the turned-off state during the first period t1. During the second period t2, a sensing control signal Read EN having the second low level LR is provided as a turn-on signal to the gate electrode of the fourth thin film transistor TFT4. Accordingly, the fourth thin film transistor TFT4 may be turned on, and the amplified sensed signal Rs provided to the first electrode of the fourth thin film transistor TFT4 may be provided to the second pen line PL2 via the second electrode of the fourth thin film transistor TFT4.

Figure 43:
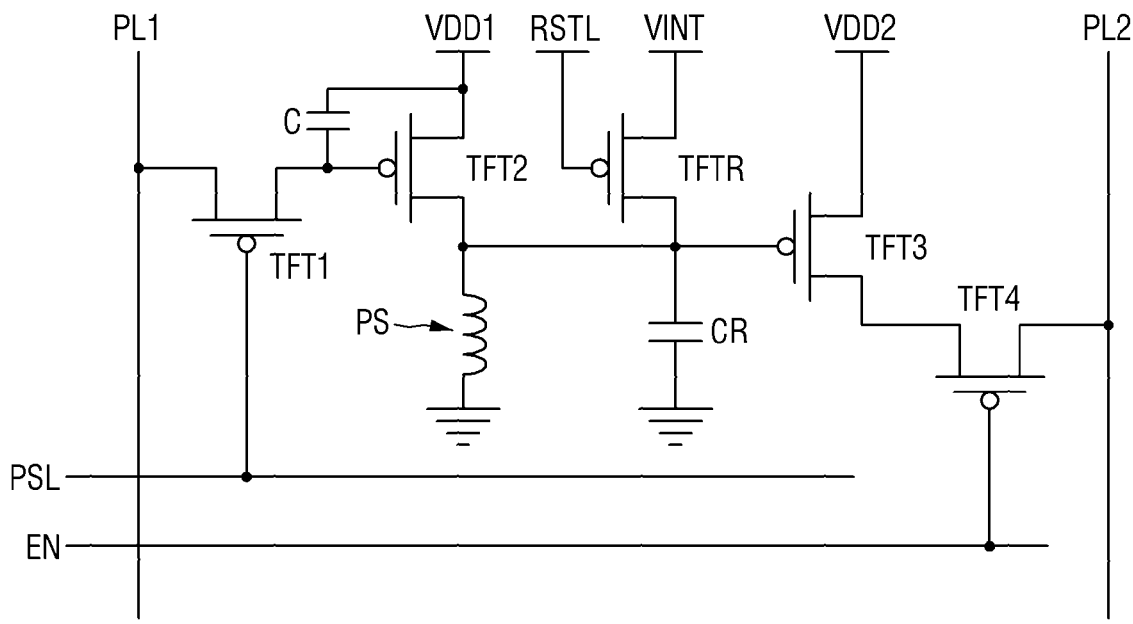
FIG. 43 is a circuit diagram illustrating a modified example of the pen sensor member illustrated in FIG. 41.

FIG. 43 is a circuit diagram illustrating a modified example of the pen sensor member illustrated in FIG. 41.

Referring to FIG. 43, the embodiment of FIG. 43 is different from the embodiment of FIG. 41 in that a capacitor C is further formed between the first driving voltage line VDD1 and the gate electrode of the second thin film transistor TFT2, and other configurations of the embodiment of FIG. 43 may be substantially the same as the embodiment of FIG. 41. Therefore, previously described descriptions will be omitted.

Figure 44:
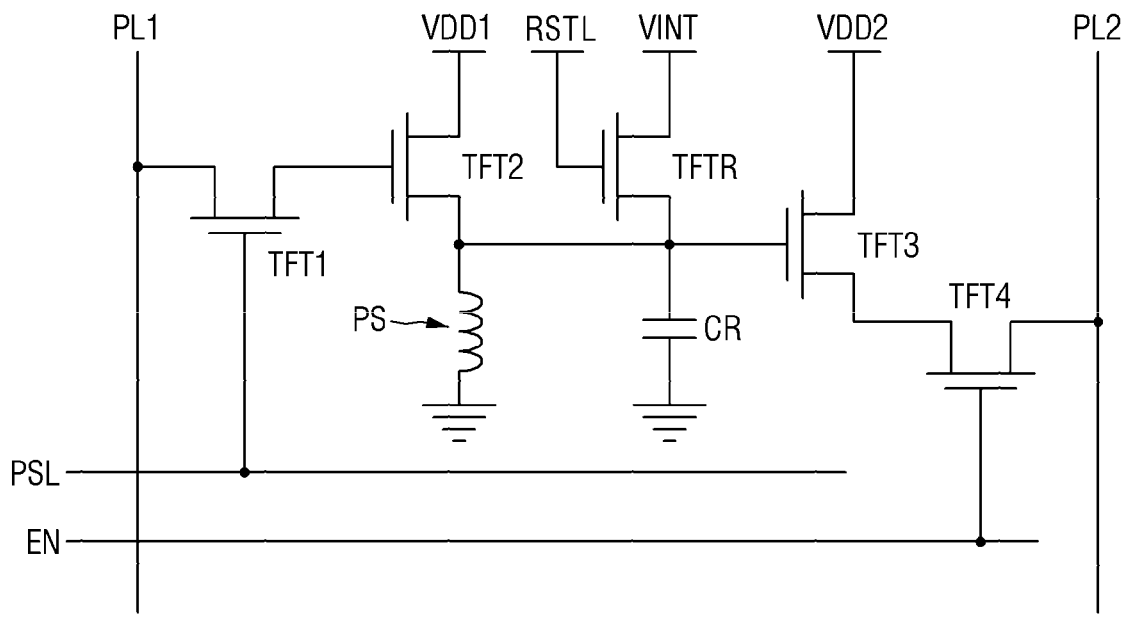
FIG. 44 is a circuit diagram illustrating another modified example of the pen sensor member illustrated in FIG. 41.
Figure 45:
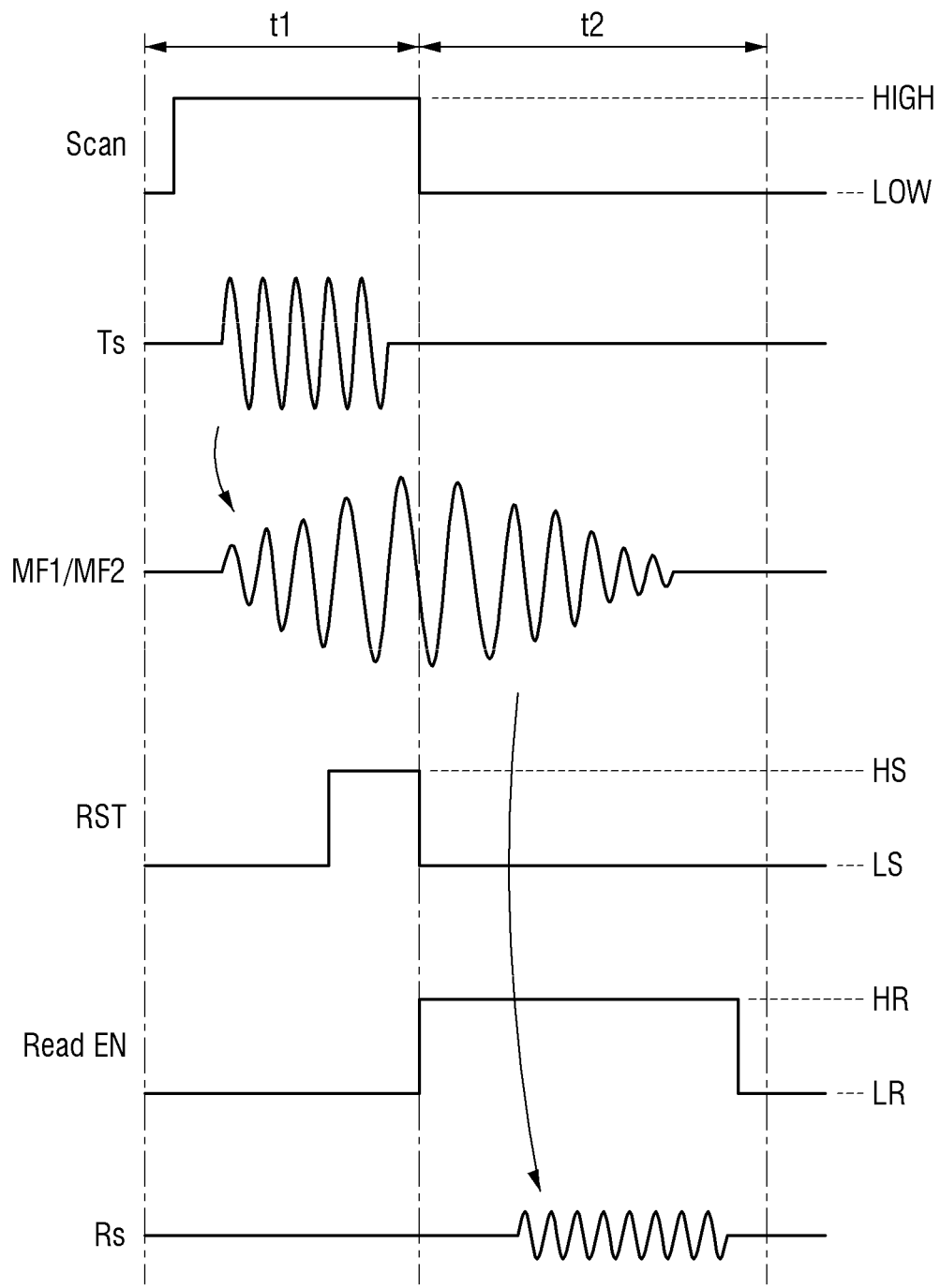
FIG. 45 is a timing diagram for describing an operation of the pen sensor member illustrated in FIG. 44.

FIG. 44 is a circuit diagram illustrating another modified example of the pen sensor member illustrated in FIG. 41, and FIG. 45 is a timing diagram for describing an operation of the pen sensor member illustrated in FIG. 44.

Referring to FIGS. 44 and 45, the embodiment of FIG. 44 is different from the embodiment of FIG. 41 in that each of the first thin film transistor TFT1, the second thin film transistor TFT2, the third thin film transistor TFT3, the fourth thin film transistor TFT4, and the reset thin film transistor TFTR is formed as an N-type transistor. Other configurations of the embodiment of FIG. 44 may be substantially the same as the embodiment of FIG. 41.

In addition, the timing diagram illustrated in FIG. 45 is different from the timing diagram of FIG. 42 in that the gate-on voltage of the scan signal Scan has the high level HIGH, the gate-off voltage of the scan signal Scan has the low level LOW, the turn-on signal of the sensing control signal Read EN which turns on the fourth thin film transistor TFT4 has the second high level HR, and the turn-off signal of the sensing control signal Read EN which turns off the fourth thin film transistor TFT4 has the second low level LR. Except for these, the operation according to the timing diagram illustrated in FIG. 45 is substantially the same as or similar to that according to the timing diagram of FIG. 42. Therefore, detailed description of previously described structures will be omitted.

Figure 46:
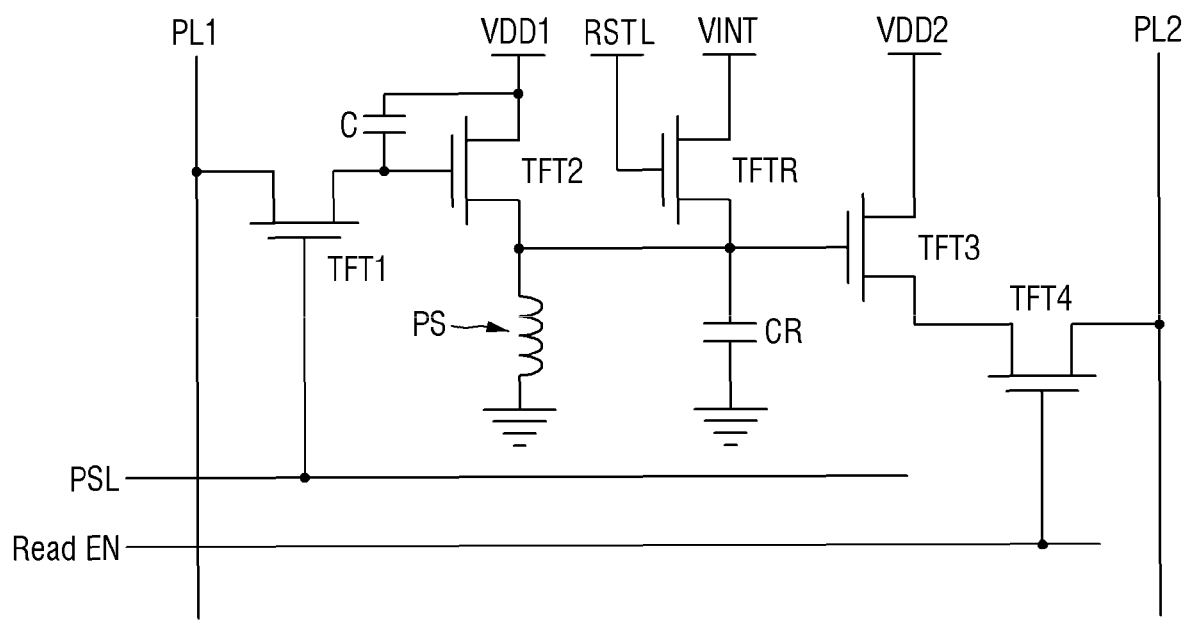
FIG. 46 is a circuit diagram illustrating a modified example of the pen sensor member illustrated in FIG. 44.

FIG. 46 is a circuit diagram illustrating a modified example of the pen sensor member illustrated in FIG. 44.

Referring to FIG. 46, the embodiment of FIG. 46 is different from the embodiment of FIG. 44 in that a capacitor C is further formed between the first driving voltage line VDD1 and the gate electrode of the second thin film transistor TFT2, and other configurations of the embodiment of FIG. 46 may be substantially the same as the embodiment of FIG. 44. Therefore, previously described descriptions will be omitted.

In addition, the structure and operation of the pen sensor member may be modified in various ways other than those mentioned in the above-described embodiments.

Figure 19:
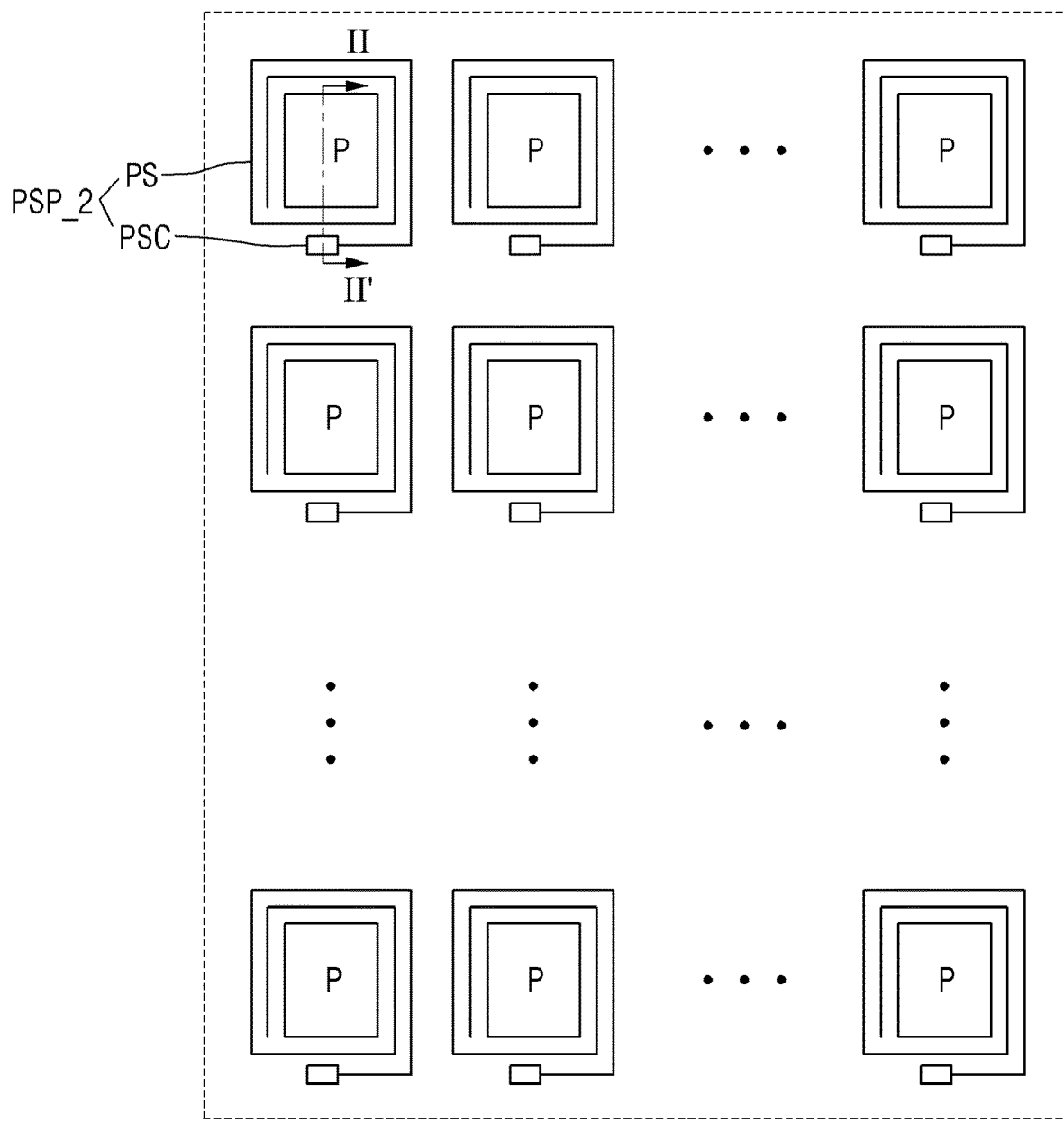
FIG. 19 is a plan view illustrating an example in which a display unit and a pen sensing unit are integrally formed.
Figure 20:
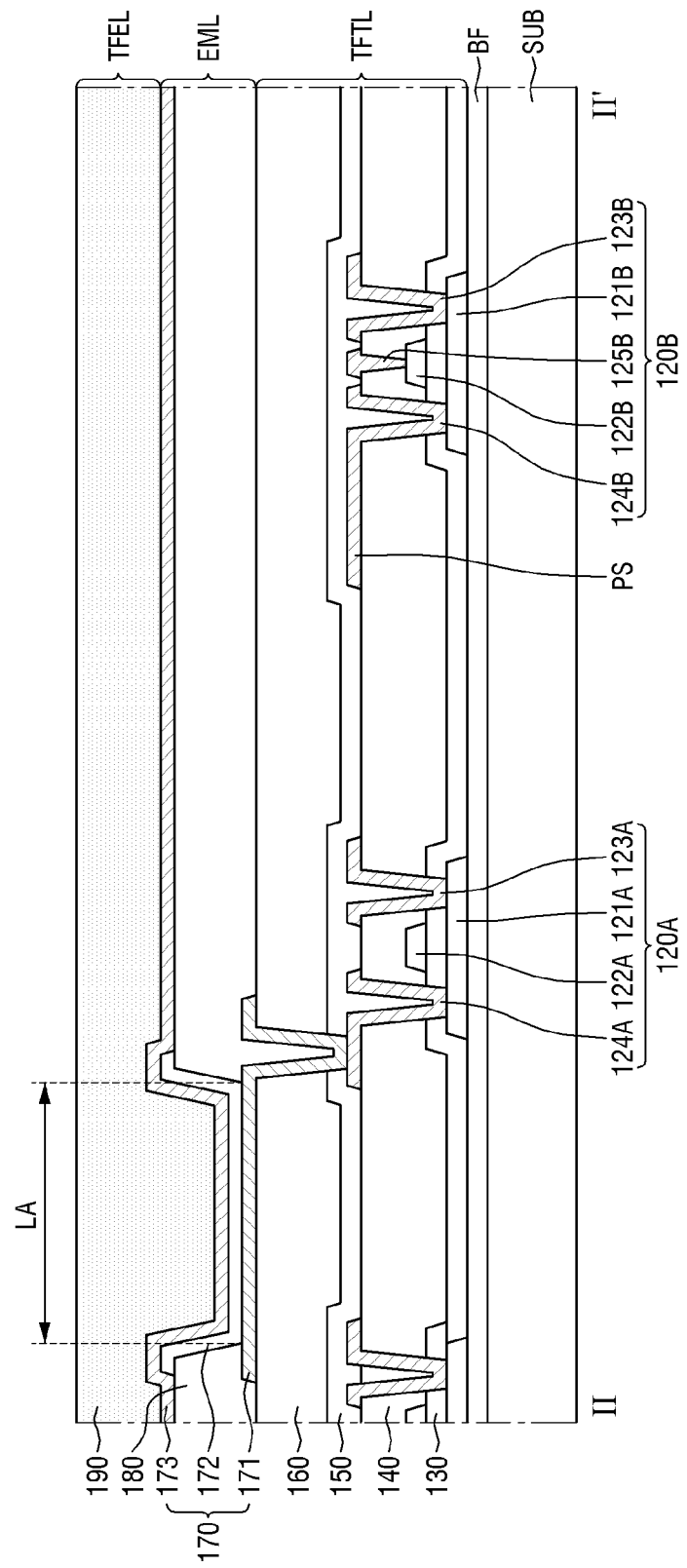
FIG. 20 is a cross-sectional view taken along line II-II' of FIG. 19.

FIG. 19 is a plan view illustrating an example in which a display unit and a pen sensing unit are integrally formed; and FIG. 20 is a cross-sectional view taken along line II-II' of FIG. 19.

Referring to FIG. 19, in some embodiments, the pen sensing unit PDU (see FIG. 2) and the display unit DU (see FIG. 2) may be integrally formed. For example, a pixel P may be disposed between pen sensor members PSP_2 of the pen sensing unit PDU (see FIG. 2).

Each pen sensor member PSP_2 may include a pen sensor circuit PSC and a pen sensor PS connected to the pen sensor circuit PSC, and the pen sensor PS may have a shape spirally wound around the pixel P. Specifically, the pen sensor PS may have a shape that is wound around the pixel P at least one time. As described above, the pen sensor circuit PSC may include at least one thin film transistor.

Referring to FIG. 20, a thin film transistor layer TFTL is formed on a substrate SUB. The thin film transistor layer TFTL includes a display thin film transistor 120A, a pen sensor thin film transistor 120B, a pen sensor PS, a gate insulating film 130, an interlayer insulating film 140, a protective film 150, and a flattening film 160. The pen sensor circuit PSC may include the pen sensor thin film transistor 120B and further include another thin film transistor. In FIG. 20, for convenience of description, only a single pen sensor thin film transistor 120B connected to the pen sensor PS is illustrated among components of the pen sensor circuit PSC.

A buffer layer BF may be formed on one surface of the substrate SUB. The buffer layer BF may be formed on one surface of the substrate SUB in order to protect the thin film transistors 120 and an organic light emitting layer 172 of a light emitting element layer EML from moisture permeating through the substrate SUB which is vulnerable to moisture permeation. The buffer layer BF may be formed of a plurality of inorganic films which are alternately stacked. For example, the buffer layer BF may be formed of a multilayer film in which one or more inorganic films of a silicon nitride layer, a silicon oxynitride layer, a silicon oxide layer, a titanium oxide layer, and an aluminum oxide layer are alternately stacked. The buffer layer BF may be omitted.

The display thin film transistor 120A and the pen sensor thin film transistor 120B are formed on the buffer layer BF. The display thin film transistor 120A and the pen sensor thin film transistor 120B include active layers 121A and 121B, gate electrodes 122A and 122B, source electrodes 123A and 123B, and drain electrodes 124A and 124B, respectively. The display thin film transistor 120A and the pen sensor thin film transistor 120B are illustrated in FIG. 20 as top gate type thin film transistors in which the gate electrodes 122A and 122B are disposed at upper portions of the active layers 121A and 121B. In embodiments, the display thin film transistor 120A and the pen sensor thin film transistor 120B may also be formed as bottom gate type thin film transistors in which the gate electrodes 122A and 122B are disposed at lower portions of the active layers 121A and 121B or as double gate thin film transistors in which the gate electrodes 122A and 122B are disposed at both the upper portions and the lower portions of the active layers 121A and 121B. Also, the pen sensor thin film transistor 120B may further include a top gate electrode 125B coming into contact with the gate electrode 122B and thus be formed of a double gate structure. In embodiments, the pen sensor thin film transistor 120B may also be formed of the same structure as the display thin film transistor 120A.

The active layers 121A and 121B of the display thin film transistor 120A and the pen sensor thin film transistor 120B are formed on the buffer layer BF. The active layers 121A and 121B may include polycrystalline silicon, monocrystalline silicon, low-temperature polycrystalline silicon, amorphous silicon, or oxide semiconductor. For example, the oxide semiconductor may include a binary compound (ABx), a ternary compound (ABxCy), or a quaternary compound (ABxCyDz) containing indium, zinc, gallium, tin, titanium, aluminum, hafnium (Hf), zirconium (Zr), magnesium (Mg), or the like. For example, the active layers 121 may include ITZO (which is oxide containing indium, tin, and zinc) or IGZO (which is oxide containing indium, gallium, and zinc). A light shielding layer for shielding external light incident on the active layers 121A and 121B may be formed between the buffer layer and the active layers 121A and 121B.

The gate insulating film 130 may be formed on the active layers 121A and 121B of the display thin film transistor 120A and the pen sensor thin film transistor 120B. The gate insulating film 130 may be formed as an inorganic film, e.g., a silicon nitride layer, a silicon oxynitride layer, a silicon oxide layer, a titanium oxide layer, or an aluminum oxide layer.

The gate electrodes 122A and 122B of the display thin film transistor 120A and the pen sensor thin film transistor 120B may be formed on the gate insulating film 130. The gate electrodes 122A and 122B may be formed of a single layer or multilayer formed of any one of molybdenum (Mo), aluminum (Al), chromium (Cr), gold (Au), titanium (Ti), nickel (Ni), neodymium (Nd), and copper (Cu) or an alloy of those elements.

The interlayer insulating film 140 may be formed on the gate electrodes 122A and 122B of the display thin film transistor 120A and the pen sensor thin film transistor 120B. The interlayer insulating film 140 may be formed as an inorganic film, e.g., a silicon nitride layer, a silicon oxynitride layer, a silicon oxide layer, a titanium oxide layer, or an aluminum oxide layer.

On the interlayer insulating film 140, the source electrodes 123A and 123B and the drain electrodes 124A and 124B of the display thin film transistor 120A and the pen sensor thin film transistor 120B may be formed. Each of the source electrodes 123A and 123B and the drain electrodes 124A and 124B may be connected to the active layers 121A and 121B through contact holes passing through the gate insulating film 130 and the interlayer insulating film 140. The source electrodes 123A and 123B and the drain electrodes 124A and 124B may be formed of a single layer or multilayer formed of any one of molybdenum (Mo), aluminum (Al), chromium (Cr), gold (Au), titanium (Ti), nickel (Ni), neodymium (Nd), and copper (Cu) or an alloy of those elements.

The top gate electrode 125B of the pen sensor thin film transistor 120B may be disposed on the interlayer insulating film 140, and the top gate electrode 125B may be connected to the gate electrode 122B through a contact hole passing through the gate insulating film 130 and the interlayer insulating film 140. Also, the pen sensor PS may be disposed on the interlayer insulating film 140, and the pen sensor PS may be connected to the drain electrode 124B of the pen sensor thin film transistor 120B. In an embodiment, the pen sensor PS may also be connected to the source electrode 123B of the pen sensor thin film transistor 120B.

The protective film 150 may be formed on the source electrodes 123A and 123B and the drain electrodes 124A and 124B of the display thin film transistor 120A and the pen sensor thin film transistor 120B, the top gate electrode 125B of the pen sensor thin film transistor 120B, and the pen sensor PS. The protective film 150 may be formed as an inorganic film including an a silicon nitride layer, a silicon oxynitride layer, a silicon oxide layer, a titanium oxide layer, and/or an aluminum oxide layer.

The flattening film 160 may be formed on the protective film 150. The flattening film 160 may be for flattening a step difference due to the thin film transistors 120. The flattening film 160 may be include an organic film such as acrylic resin, epoxy resin, phenolic resin, polyamide resin, and/or polyimide resin.

The light emitting element layer EML is formed on the thin film transistor layer TFTL. The light emitting element layer EML may include light emitting elements 170 and a bank layer 180.

The light emitting elements 170 and the bank layer 180 are formed on the flattening film 160. Each light emitting element 170 may include a first electrode 171 of the light emitting element 170, the organic light emitting layer 172, and a second electrode 173 of the light emitting element 170.

The first electrode 171 of the light emitting element 170 may be formed on the flattening film 160. The first electrode 171 of the light emitting element 170 is connected to the source electrodes 123 of the thin film transistors 120 through a contact hole passing through the protective film 150 and the flattening film 160.

In a top emission structure, light is emitted toward the second electrode 173 of the light emitting element 170 from the organic light emitting layer 172. The first electrode 171 of the light emitting element 170 may be formed of a conductive material having a high reflectivity such as a laminated structure of aluminum and titanium (Ti/Al/Ti), a laminated structure of aluminum and ITO (ITO/Al/ITO), an APC alloy, and a laminated structure of the APC alloy and ITO (ITO/APC/ITO). The APC alloy is an alloy of silver (Ag), palladium (Pd), and copper (Cu).

In a bottom emission structure, light is emitted toward the first electrode 171 of the light emitting element 170 from the organic light emitting layer 172. The first electrode 171 of the light emitting element 170 may be formed of a transparent conductive material (TCO) such as ITO and IZO capable of transmitting lightor a semi-transmissive conductive material such as magnesium (Mg), silver (Ag), or an alloy of magnesium (Mg) and silver (Ag). When the first electrode 171 of the light emitting element 170 is formed of the semi-transmissive conductive material, light output efficiency may be improved due to a micro-cavity.

The bank layer 180 may be formed to divide the first electrode 171 of the light emitting element 170 on the flattening film 160 in order to define light emitting areas LA. For example, the bank layer 180 may be formed to cover an edge of the first electrode 171 of the light emitting element 170 and include an opening through which an upper surface of the first electrode 171 of the light emitting element 170 is exposed. The bank layer 180 may be formed as an organic film such as acrylic resin, epoxy resin, phenolic resin, polyamide resin, or polyimide resin.

Each light emitting area LA refers to an area in which the first electrode 171 of the light emitting element 170, the organic light emitting layer 172, and the second electrode 173 of the light emitting element 170 are sequentially stacked, and holes from the first electrode 171 of the light emitting element 170 and electrons from the second electrode 173 of the light emitting element 170 combine with each other at the organic light emitting layer 172 such that light is emitted. Each light emitting area LA may include the light emitting element 170.

The organic light emitting layer 172 is formed on the first electrode 171 of the light emitting element 170 and the bank layer 180. The organic light emitting layer 172 may include an organic material and emit light of a particular color. For example, the organic light emitting layer 172 may include a hole transporting layer, an organic material layer, and an electron transporting layer. The organic light emitting layer 172 may emit light of a first color, light of a second color, and light of a third color for each light emitting area LA. The first color may be red, the second color may be green, and the third color may be blue.

Alternatively, the organic light emitting layer 172 may emit white light in each light emitting area LA. In this case, a color filter may be disposed at an upper portion of the light emitting element layer EML.

The second electrode 173 of the light emitting element 170 is formed on the organic light emitting layer 172. The second electrode 173 of the light emitting element 170 may be formed to cover the organic light emitting layer 172. The second electrode 173 of the light emitting element 170 may be a common layer formed commonly to subpixels RP, GP, and BP. A capping layer may be formed on the second electrode 173 of the light emitting element 170.

In the top emission structure, the second electrode 173 of the light emitting element 170 may be formed of a TCO such as ITO and IZO capable of transmitting light or a semi-transmissive conductive material such as magnesium (Mg), silver (Ag), or an alloy of magnesium (Mg) and silver (Ag). When the second electrode 173 of the light emitting element 170 is formed of the semi-transmissive conductive material, light output efficiency may be improved due to a micro-cavity.

In the bottom emission structure, the second electrode 173 of the light emitting element 170 may be formed of a conductive material having a high reflectivity such as a laminated structure of aluminum and titanium (Ti/Al/Ti), a laminated structure of aluminum and ITO (ITO/Al/ITO), an APC alloy, and a laminated structure of the APC alloy and ITO (ITO/APC/ITO). The APC alloy is an alloy of silver (Ag), palladium (Pd), and copper (Cu).

The thin film encapsulation layer TFEL is formed on the light emitting element layer EML. The thin film encapsulation layer TFEL includes an encapsulation film 190.

The encapsulation film 190 is disposed on the second electrode 173 of the light emitting element 170. The encapsulation film 190 may include at least one inorganic film in order to prevent permeation of oxygen or moisture into the organic light emitting layer 172 and the second electrode 173 of the light emitting element 170. The encapsulation film 190 may also include at least one organic film in order to protect the light emitting element layer EML from foreign substances such as dust. For example, the encapsulation film 190 may include a first inorganic film disposed on the second electrode 173 of the light emitting element 170, an organic film disposed on the first inorganic film, and a second inorganic film disposed on the organic film. The first inorganic film and the second inorganic film may be formed of a silicon nitride layer, a silicon oxynitride layer, a silicon oxide layer, a titanium oxide layer, and/or an aluminum oxide layer. The organic film may be formed of acrylic resin, epoxy resin, phenolic resin, polyamide resin, polyimide resin, and/or the like.

In this way, the pen sensing unit PDU (see FIG. 2) may be integrally formed with the display unit DU (see FIG. 2). In this case, it is possible to simplify the process while implementing the thin-type display device 10 (see FIG. 2).

Figure 21:
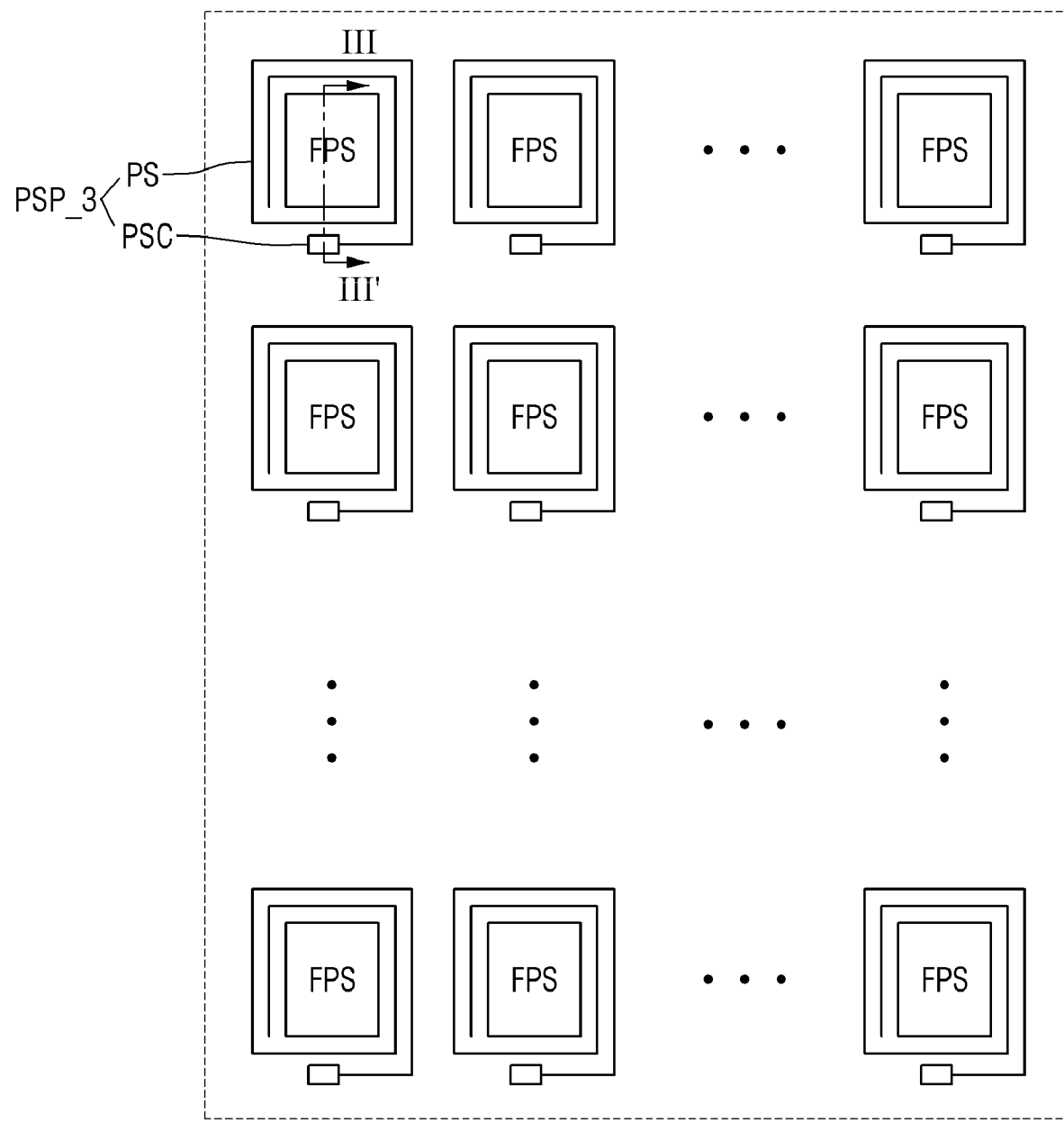
FIG. 21 is a plan view illustrating an example in which a fingerprint sensing unit and a pen sensing unit are integrally formed.
Figure 22:
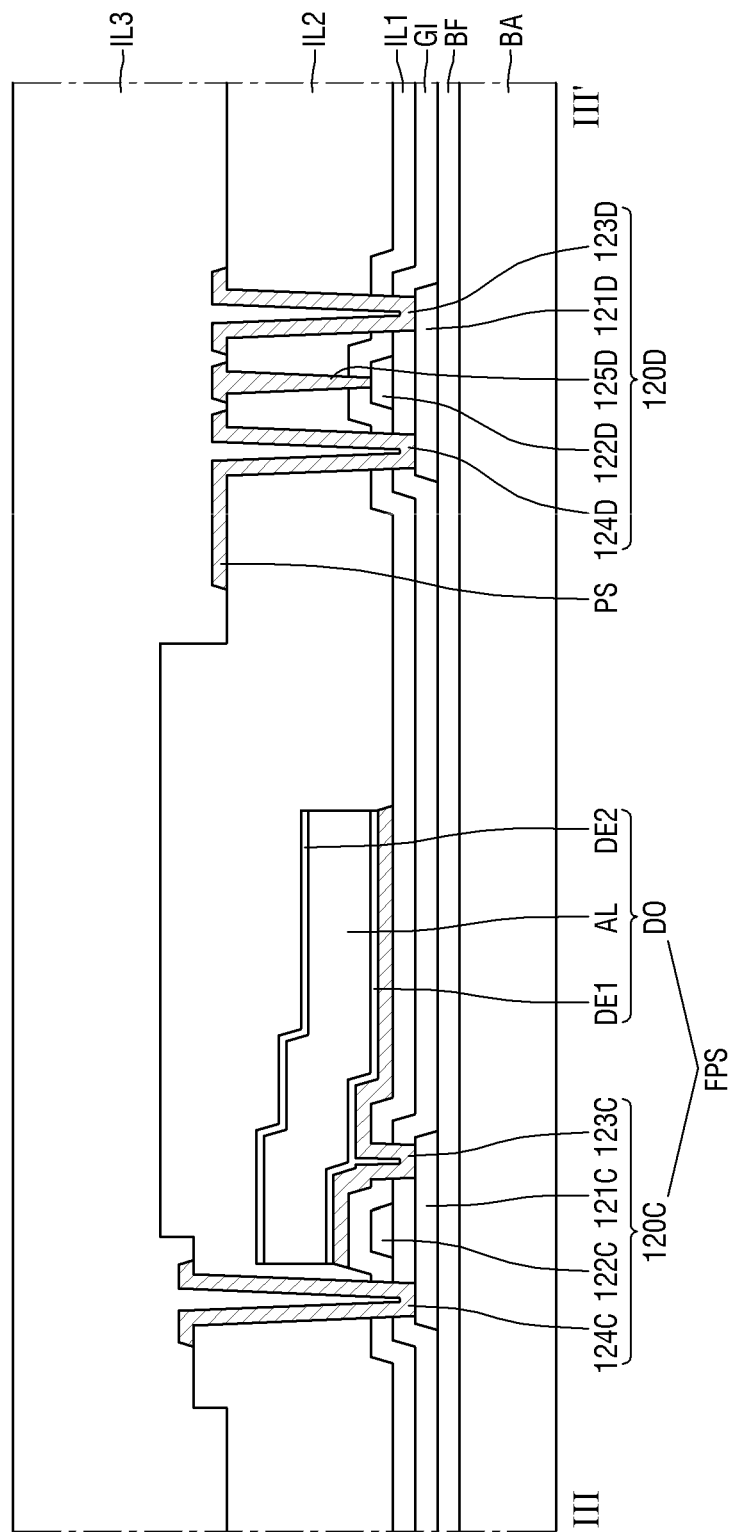
FIG. 22 is a cross-sectional view taken along line III-III' of FIG. 21.

FIG. 21 is a plan view illustrating an example in which a fingerprint sensing unit and a pen sensing unit are integrally formed; and FIG. 22 is a cross-sectional view taken along line III-III' of FIG. 21. The embodiment of FIGS. 21 and 22 is different from the embodiment of FIGS. 19 and 20 in that the pen sensor and the pen sensor thin film transistor are formed by the same process as a fingerprint thin film transistor. Previously described descriptions of the embodiment of FIGS. 19 and 20 will be omitted.

Referring to FIG. 21, in some embodiments, the pen sensing unit PDU (see FIG. 2) and the fingerprint sensing unit FDU (see FIG. 2) may be integrally formed. For example, a fingerprint recognition sensor FPS may be disposed between pen sensor members PSP_3 of the pen sensing unit PDU (see FIG. 2).

Each pen sensor member PSP_3 may include a pen sensor circuit PSC and a pen sensor PS connected to the pen sensor circuit PSC, and the pen sensor PS may have a shape spirally wound around the fingerprint recognition sensor FPS. Specifically, the pen sensor PS may have a shape that is wound around the fingerprint recognition sensor FPS at least one time. As described above, the pen sensor circuit PSC may include at least one thin film transistor.

Referring to FIG. 22, a buffer layer BF may be formed on a base layer BA.

A fingerprint thin film transistor 120C and a pen sensor thin film transistor 120D are formed on the buffer layer BF. The pen sensor circuit PSC may include the pen sensor thin film transistor 120D and further include another thin film transistor.

The fingerprint thin film transistor 120C and the pen sensor thin film transistor 120D include active layers 121C and 121D, gate electrodes 122C and 122D, source electrodes 123C and 123D, and drain electrodes 124C and 124D. Also, the pen sensor thin film transistor 120D may further include a top gate electrode 125D coming into contact with the gate electrode 122D and thus be formed of a double gate structure.

The fingerprint thin film transistor 120C may include a diode DO. The diode DO may include a first electrode DE1 of the diode DO, an active layer AL, and a second electrode DE2 of the diode DO, and the fingerprint thin film transistor 120C and the diode DO constitute the fingerprint recognition sensor FPS. That is, the fingerprint recognition sensor FPS may be a phototransistor. The phototransistor, which is a type of light sensor which converts light energy to electrical energy, uses a photoelectromotive force effect in which current flowing therein changes according to an intensity of light. The phototransistor amplifies the photocurrent using a transistor. The phototransistor may sense a change in current according to an intensity of light reflected by a fingerprint and recognize a fingerprint pattern.

The active layers 121C and 121D of the fingerprint thin film transistor 120C and the pen sensor thin film transistor 120D are formed on the buffer layer BF.

A gate insulating film GI may be formed on the active layers 121C and 121D of the fingerprint thin film transistor 120C and the pen sensor thin film transistor 120D.

The gate electrodes 122C and 122D of the fingerprint thin film transistor 120C and the pen sensor thin film transistor 120D may be formed on the gate insulating film GI.

A first insulating layer IL1 may be formed on the gate electrodes 122C and 122D of the fingerprint thin film transistor 120C and the pen sensor thin film transistor 120D.

The source electrode 123C of the fingerprint thin film transistor 120C may be disposed on the first insulating layer IL1. The above-described diode DO may be disposed on the source electrode 123C of the fingerprint thin film transistor 120C. For example, the first electrode DE1 of the diode DO, the active layer AL, and the second electrode DE2 of the diode DO may be sequentially disposed on the source electrode 123C of the fingerprint thin film transistor 120C.

A second insulating layer IL2 may be disposed on the first insulating layer IL1 and the diode DO.

The drain electrode 124C of the fingerprint thin film transistor 120C, the source electrode 123D, the drain electrode 124D, the top gate electrode 125D of the pen sensor thin film transistor 120D, and the pen sensor PS may be formed on the second insulating layer IL2.

A third insulating layer IL3 may be formed on the drain electrode 124C of the fingerprint thin film transistor 120C, the source electrode 123D, the drain electrode 124D, the top gate electrode 125D of the pen sensor thin film transistor 120D, and the pen sensor PS.

Meanwhile, although not illustrated, when the pen sensing unit PDU (see FIG. 2) is formed as a separate configuration, the pen sensing unit PDU may be implemented by a structure in which only the fingerprint recognition sensor FPS is omitted from FIG. 22.

According to an embodiment, since a pen sensing unit has a pen sensor member disposed in each region, a sensitivity characteristic of the pen sensing unit can be improved.

Advantageous effects according to the embodiments are not limited to that mentioned above, and various other advantageous effects are incorporated herein.

Embodiments of the present disclosure have been described above with reference to the accompanying drawings, but those of ordinary skill in the art to which the present disclosure pertains should understand that the present disclosure may be practiced in other specific forms without changing the technical idea or essential features of the present disclosure. Therefore, the embodiments described above should be understood as being illustrative in all aspects instead of limiting.

What is claimed is:

1. A pen sensing unit comprising:
   a first pen line extending in a first direction;
   a pen scan line extending in a second direction intersecting the first direction; and
   a pen sensor member connected to the first pen line and the pen scan line and configured to sense input from a pen,
   wherein the pen sensor member comprises a pen sensor and a pen sensor circuit connected to a first end of the pen sensor, the pen sensor circuit comprising a first thin film transistor,
   wherein a gate electrode of the first thin film transistor is connected to the pen scan line, a first electrode of the first thin film transistor is connected to the first end of the pen sensor, and a second electrode of the first thin film transistor is connected to the first pen line.

2. The pen sensing unit of claim 1, wherein the first thin film transistor is configured to connect the first pen line with the first end of the pen sensor when a scan signal applied to the pen scan line turns on the first thin film transistor.

3. The pen sensing unit of claim 2, wherein a second end of the pen sensor is connected to a ground power source.

4. The pen sensing unit of claim 3, wherein the pen sensor has a spirally wound shape.

5. The pen sensing unit of claim 4, wherein a length of the pen sensor member in the first direction and a length of the pen sensor member in the second direction are each from 1 mm to 10 mm.

6. The pen sensing unit of claim 5, wherein the pen sensor member is a plurality of pen sensor members arranged together in a matrix.

7. A pen sensing unit comprising:
a first pen line extending in a first direction;
a pen scan line extending in a second direction intersecting the first direction; and
a pen sensor member connected to the first pen line and the pen scan line and configured to sense input from a pen,
wherein the pen sensor member comprises a pen sensor and a pen sensor circuit connected to a first end of the pen sensor, the pen sensor circuit comprising a first thin film transistor,
wherein the pen sensor circuit further comprises a second thin film transistor, a gate electrode of the first thin film transistor is connected to the pen scan line, a first electrode of the first thin film transistor is connected to a gate electrode of the second thin film transistor, and a second electrode of the first thin film transistor is connected to the first pen line.

8. The pen sensing unit of claim 7, further comprising a second pen line spaced apart from the first pen line,
wherein the pen sensor member is disposed between the first pen line and the second pen line,
wherein the pen sensor circuit further comprises a first driving voltage line, and
wherein the gate electrode of the second thin film transistor is connected to the first electrode of the first thin film transistor, a first electrode of the second thin film transistor is connected to the first end of the pen sensor, and a second electrode of the second thin film transistor is connected to the first driving voltage line.

9. The pen sensing unit of claim 8, wherein the first electrode of the second thin film transistor is connected to the second pen line.

10. The pen sensing unit of claim 9, further comprising a capacitor disposed between the driving voltage line and a gate electrode of the second thin film transistor.

11. The pen sensing unit of claim 10, wherein a second end of the pen sensor is connected to a ground power source.

12. The pen sensing unit of claim 11, wherein the pen sensor has a spirally wound shape.

13. The pen sensing unit of claim 8, wherein the pen sensor circuit further comprises a third thin film transistor, and a second driving voltage line spaced apart from the first driving voltage line, and
wherein a gate electrode of the third thin film transistor is connected to the first electrode of the second thin film transistor, a first electrode of the third thin film transistor is connected to the second pen line and a ground power source, and a second electrode of the third thin film transistor is connected to the second driving voltage line.

14. The pen sensing unit of claim 13, further comprising a capacitor disposed between the driving voltage line and the gate electrode of the second thin film transistor.

15. The pen sensing unit of claim 14, wherein a second end of the pen sensor is connected to a ground power source.

16. A display device comprising:
a display unit comprising a plurality of pixels; and
a pen sensing unit disposed below the display unit and comprising a plurality of pen lines extending in a first direction, a pen scan line extending in a second direction intersecting the first direction, and a plurality of pen sensor members each connected to the pen scan line and a pen line among the plurality of pen lines and configured to sense input from a pen,
wherein each of the plurality of pen sensor members comprises a pen sensor and a pen sensor circuit connected to a first end of the pen sensor, and the pen sensor circuit comprises a first thin film transistor,
wherein a gate electrode of the first thin film transistor is connected to the pen scan line, a first electrode of the first thin film transistor is connected to the first end of the pen sensor, and a second electrode of the first thin film transistor is connected to the pen line.

17. The display device of claim 16, wherein the first thin film transistor is configured connect the pen line and the first end of the pen sensor when a scan signal applied to the pen scan line turns on the first thin film transistor, a second end of the pen sensor is connected to a ground power source, and the pen sensor has a spirally wound shape.

18. The display device of claim 17, further comprising:
a touch sensing unit disposed over the display unit and configured to sense a user's touch; and
a fingerprint sensing unit disposed between the display unit and the pen sensing unit and configured to recognize a user's fingerprint pattern.

19. A display device comprising:
a display unit comprising a plurality of pixels; and
a pen sensing unit disposed below the display unit and comprising a plurality of pen lines extending in a first direction, a pen scan line extending in a second direction intersecting the first direction, and a plurality of pen sensor members each connected to the pen scan line and a pen line among the plurality of pen lines and configured to sense input from a pen,
wherein each of the plurality of pen sensor members comprises a pen sensor and a pen sensor circuit connected to a first end of the pen sensor, and the pen sensor circuit comprises a first thin film transistor,
wherein the pen sensor circuit further comprises a second thin film transistor, a gate electrode of the first thin film transistor is connected to the pen scan line, a first electrode of the first thin film transistor is connected to a gate electrode of the second thin film transistor, and a second electrode of the first thin film transistor is connected to the first pen line.

* * * * *

UNITED STATES PATENT AND TRADEMARK OFFICE
CERTIFICATE OF CORRECTION

| | | |
|---|---|---|
| PATENT NO. | : 11,287,933 B2 | Page 1 of 1 |
| APPLICATION NO. | : 16/924078 | |
| DATED | : March 29, 2022 | |
| INVENTOR(S) | : Chul Kim, Soo Jung Lee and Keum Dong Jung | |

It is certified that error appears in the above-identified patent and that said Letters Patent is hereby corrected as shown below:

On the Title Page

Item (75) In the list of Inventors: Replace "Chui Kim" with "Chul Kim".

Signed and Sealed this
Seventeenth Day of October, 2023

Katherine Kelly Vidal
Director of the United States Patent and Trademark Office